United States Patent [19]

Fujitani

[11] Patent Number: 4,580,234

[45] Date of Patent: Apr. 1, 1986

[54] MEASUREMENT SYSTEM OF ENHANCED RELIABILITY

[75] Inventor: Shinichi Fujitani, Tokyo, Japan

[73] Assignee: Nippon Business Consultant Co., Ltd., Tokyo, Japan

[21] Appl. No.: 515,911

[22] Filed: Jul. 20, 1983

[30] Foreign Application Priority Data

Aug. 2, 1982 [JP] Japan ............................. 57-135536
Feb. 4, 1983 [JP] Japan ............................. 58-16971

[51] Int. Cl.⁴ .......................................... G06F 15/20
[52] U.S. Cl. .................................... 364/550; 364/571
[58] Field of Search .............................. 364/550, 571

[56] References Cited

U.S. PATENT DOCUMENTS 4,000,643  1/1977  Pearson ........................... 364/571 X
4,189,017  2/1980  Stobel et al. ..................... 364/571 X
4,416,067  11/1983 Scherer et al. ................. 364/571 X

OTHER PUBLICATIONS

Prof. Hiroo Yamasaki, "Design Principles of Measuring Instrument", *Journal of the Society of Instrument and Control Engineers*, pp. 92–97, vol. 21, No. 3, (Mar. 1982).

Primary Examiner—Edward J. Wise
Attorney, Agent, or Firm—Kinney & Lange

[57] ABSTRACT

As a means to enhance the reliability of a measurement system and render the measurement system tolerant of failure, the method which comprises tripling the component elements of the measurement system, for example, providing three thermometers to measure one and the same temperature and selecting a correct measured value by the logic of decision by majority has found popular recognition in the art. This method, however, entails many problems such as increased cost, increased weight, and increased volume because it necessitates the component elements thereof to be tripled.

This invention, owing to the addition to the measurement system of a check signal generator adapted to produce a check signal which is the linear combination of functional values of physical quantities under measurement, enables the measurement system to materialized detection of failure, identification of the site of failure, and recovery of a correct measured value by feeding the produced check signal in parallel with the former measured values into a computer and causing the computer to perform prescribed arithmetic operations by using the check signal and the measured value. Thus, the invention enables the measurement system to acquire enhanced reliability of performance and improved tolerance against failure by the incorporation of decisively few redundant component elements as compared with the conventional method which necessitates the component elements to be tripled.

13 Claims, 22 Drawing Figures 4,580,234

MEASUREMENT SYSTEM OF ENHANCED RELIABILITY

BACKGROUND OF THE INVENTION

1. Field of the Invention

This invention relates to a method for enhancing the reliability of performance of a measurement system and rendering the measurement system tolerant of failure, and more particularly to a method for promoting the elevation of reliability of a system for the measurement of a plurality of physical quantities and warranting the tolerance of the measurement system against failure by adding to the measurement system the irreducible minimum of redundant element.

2. Description of the Prior Art

Numerous industrial systems require addition thereto, as a sub-system therefor, of a measurement system which measures the magnitudes of various physical quantities such as temperature and pressure and feeds the measured values to a computer. A diagram illustrating the concept of this measurement system is illustrated in FIG. 1.

A measurement system 3 is interposed between a process to be measured 4 and a computer 5. It is composed of a sensor unit 1 for transducing the magnitude of a physical quantity under measurement which is analogous in nature into another analogous quantity 7 such as voltage and a data acquisition system (such as, for example, an A/D converter) for feeding the measured value 8 into the computer 5.

When a great distance separates the objective process of measurement 4 and the computer 5 from each other, the data acquisition system 2 incorporates therein, as a sub-system therefor, a transmission system for transferring the sensor output.

Generally when failure develops in the measurement system 3, the operation of the system as a whole becomes abnormal. To promote the elevation of reliability of the industrial system as a whole, therefore, the measurement system 3 which is a sub-system for the industrial system is required to provide highly reliable performance.

Thus, it is essential that the measurement system 3 should be rendered tolerant of failure by some means or other, namely, it should be made to function correctly at least in outward appearance even when failure occurs in part of the measurement system 3.

To render the measurement system tolerant of failure, it is generally necessary that the "method for conferring redundancy upon the system" should be unified with the "method for repair of failure" which is capable of detecting the failure, identifying the failure, isolating the failure, and effecting recovery from the failure by processing the redundant signal issuing fron the former method.

It is the TMR (triple modular redandancy) method which has found popular recognition as a method available for rendering the measurement system tolerant of failure. For the purpose of rendering the system redundant, this method triples sensors and other component elements required for handling every physical quantity under measurement. And for the purpose of "reconfiguration of failure," this method applies the logic of decision by majority to the three measured values. In case where r physical quantities are to be measured, this method requires preparation of 3r sensors. Thus, this method triples the component elements of hardware.

This method, accordingly, suffers from a disadvantage that the measurement system will have increased volume and weight and the cost of equipment will be proportionally increased.

OBJECT OF THE INVENTION

An object of this invention is to provide a measurement system which, by the lowest possible addition to system configuration with a nominal increase in cost, acquires required reliability and consequently gives a solution of the disadvantages suffered by the conventional measurement system.

Another object of this invention is to provide a measurement system which, simply by the addition thereto of at least one redundant element, warrants desired enhancement of the reliability of the entire measurement system embracing even sensor units.

Yet another object of this invention is to provide a method which, by the addition of a plurality of redundant elements to a measurement system, renders the entire measurement system embracing even sensor units tolerant of failure.

BRIEF SUMMARY OF THE INVENTION

To accomplish the objects described above according to the present invention, there is provided a method which, in a measurement system adapted to measure magnitudes of a plurality of physical quantities and feed the measured values severally to a computer, enables the measurement system to acquire enhanced reliability and renders the measurement system tolerant of failure by separately adding to the measurement system at least one check signal generator capable of producing a check signal which is the linear combination of functional values of the magnitudes of the aforementioned physical quantities and feeding the check signal in parallel with each of the aforementioned measured values to the computer.

DETAILED DESCRIPTION OF THE INVENTION

The demand for electric power is steadily increasing with the growth of industries. This demand has now reached a point where introduction of ultra-high voltage power transmission systems rated for somewhere about 500,000 to 1,000,000 volts will find general approval. In the measurement of electric current through power lines used in such an ultra-high voltage power transmission, the electromagnetic current transformer, namely, the electromagnetic CT which has heretofore found popular acceptance, proves unserviceable on account of insufficient insulation of the instrument from the huge voltage of the current of interest.

In the circumstance, the optical CT for current measurement which is an applied sensor of the optical fiber featuring low loss and high insulation is urged to mature into a practicable device befitting the aforementioned measurement of current of ultra-high voltage.

Figure 1:
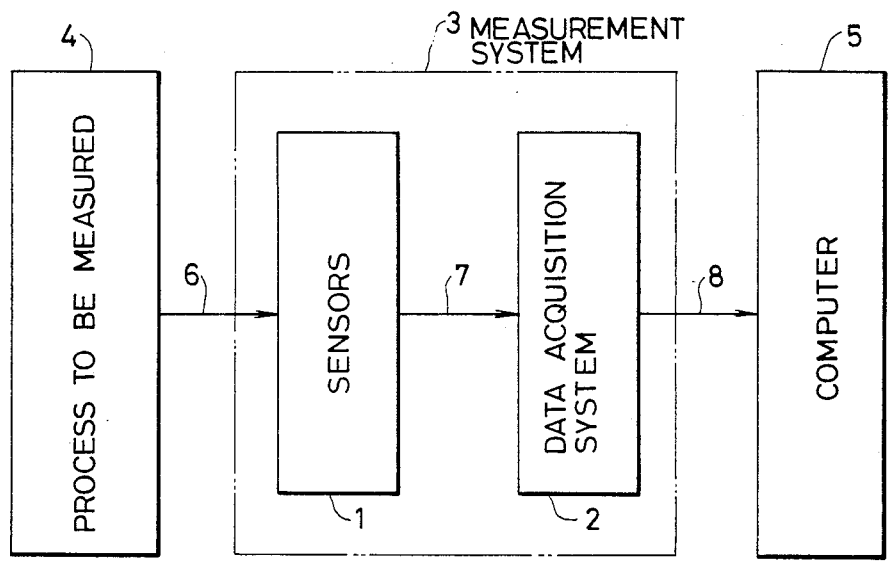
FIG. 1 is a diagram illustrating the concept of a measurement system to which the present invention is applied.
Figure 2:
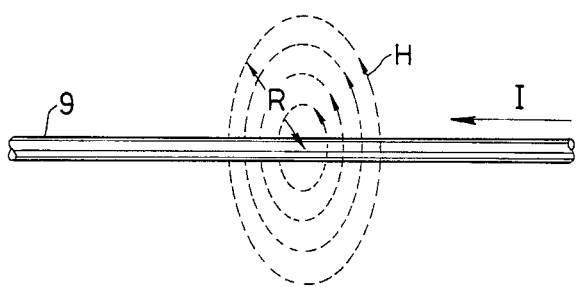
FIG. 2 is a diagram illustrating the principle of measurement in a known optical CT (Current Transformer).

FIG. 2 is a diagram which illustrates the principle of measurement of the optical CT.

As electric current I flows through a power transmission line 9, a magnetic field occurs around the power transmission line 9. A magnetic field H separated by a radius R from the power transmission line 9 is represented by the following formula.

$$H = I/2\pi R \qquad (1)$$

By taking measurement of this magnetic field H, therefore, the current I can be calculated in accordance with the foregoing formula (1).

The optical CT is intended to measure this magnetic field H by making use of Faraday effect.

By "Faraday effect" is meant the phenomenon that when a transparent substance 12 such as glass (hereinafter referred to as "Faraday rotator") is inserted within the magnetic field 15 and a linearly polarized light 14 advancing parallelly to the direction of the magnetic field is allowed to pass through the Faraday rotator, the plane of polarization of light is rotated. The angle of this rotation $\theta$, is in direct proportion to the length L, of the Faraday rotator 12 and the intensity H, of the magnetic field 15 as represented by the following formula (2).

$$\theta = V_e H L \qquad (2)$$

Figure 3:
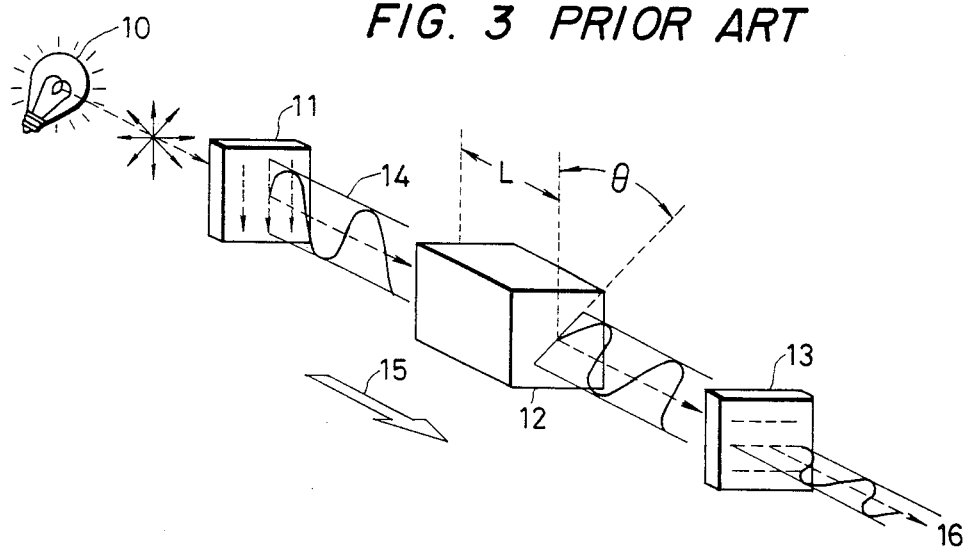
FIG. 3 is an explanatory diagram for illustrating the Faraday effect kown to the art.

Here, the constant of proportion $V_e$, is called "Verdet constant" and it is fixed by the particular substance of which the Faraday rotator is made. In FIG. 3, 10 denotes a light source, 11 a polarizer, 13 a detector, and 16 an output light.

Figure 4:
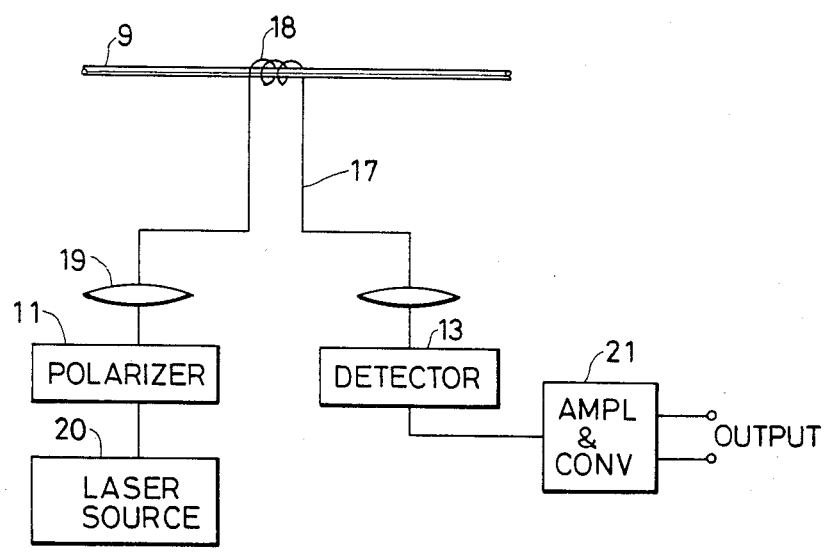
FIG. 4 is a diagram illustrating the basic configuration of the conventional optical CT.

FIG. 4 is a diagram which illustrates the basic configuration of the known optical CT.

A beam from a laser light source 20 is polarized with the polarizer and the resultant linearly polarized light is injected into a single mode optical fiber 17 through a lens 19A. This single mode optical fiber 17 is wound round the power transmission line 9 some tens of turns to form a Faraday rotator. The output light from the optical fiber 17 is fed through a lens 19B and the detector 13 into an amplifier-converter 21. By the arrangement described above, the optical system for measurement illustrated in FIG. 3 is completed.

Assume that the optical fiber 17 is wound N turns round the power transmission line 7 in the arrangement of FIG. 4, and the length L, of the optical fiber thus wound on the line or the Faraday rotator will be represented by the following formula (3).

$$L = 2\pi R \cdot N \qquad (3)$$

From the foregoing formulas (1) and (2) coupled with the formula (3), there is derived the following formula (4).

$$\theta = V_e \cdot N \cdot I \qquad (4)$$

Since the angle of rotation $\theta$, of the plane of polarization can be detected from the intensity of the light passing the detector 13, the current I is calculated from the foregoing formula (4).

Figure 5:
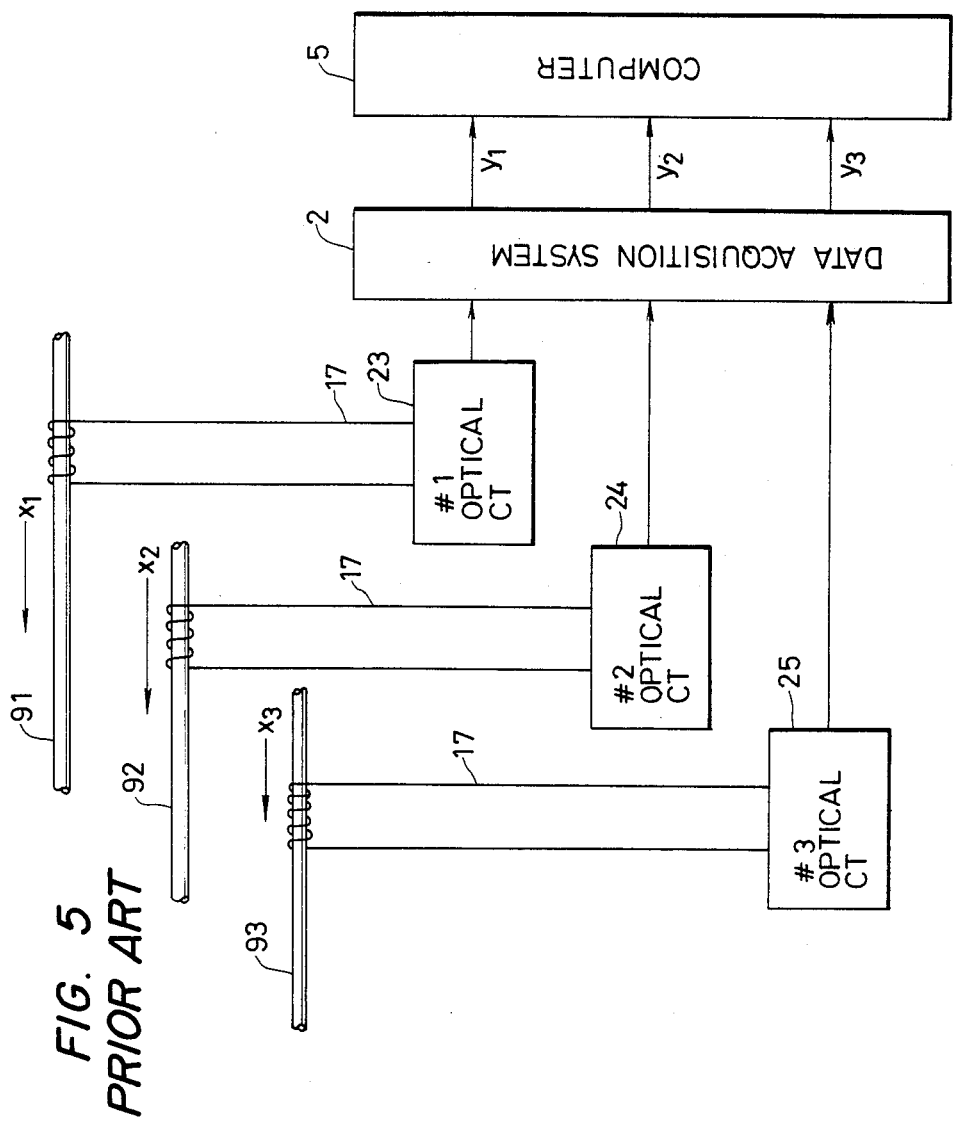
FIG. 5 is a diagram illustrating the concept of a conventional system used for the measurement of electric current in a power transmission line.

FIG. 5 is a diagram illustrating the concept of the conventional system used for measuring the electric current in the power transmission line by use of the optical CT.

In the arrangement of FIG. 5, electric currents flowing through three power transmission lines 91–93 are measured by first through third optical CT's 23–25 and the measured values are fed out to the data acquisition system 2.

Figure 6:
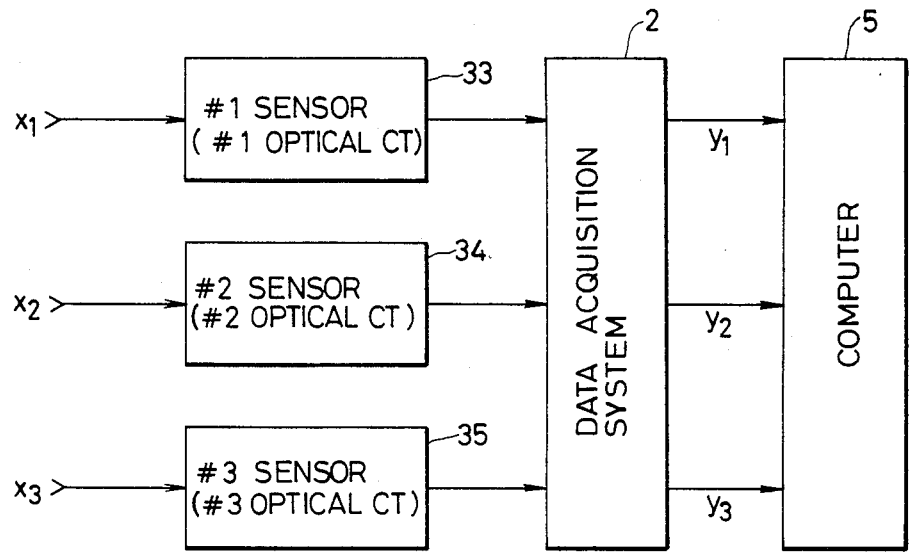
FIG. 6 is a block diagram of the system of FIG. 5, with emphasis focussed on the flow of data.

This configuration of the current measurement system is depicted, with emphasis focussed on the flow of data, in FIG. 6. The currents $x_1$ through $x_3$, are detected respectively by sensors 33–35 which severally contain an optical CT. The measured analog values of currents are fed out to the data acquisition system 2 and are respectively converted into digital signals $y_1$, $y_2$, and $y_3$, which are fed out to the computer 5.

Since the current of ultra-high voltage cannot be appropriately measured by any other means than light, development of the measurement system which utilizes optical CT's as described above is earnestly longed for. This measurement system has not yet matured fully into a practicable device because the optical CT's destined to play the part of sensors still suffer from the problem of insufficient reliability of performance. Researches in this field, therefore, are urged to continue their efforts for improving the reliability of optical CT's as unit elements and, at the same time, strive to develop a method which promotes coordination among all the component elements making up a measurement system and consequently enhances the reliability of the measurement system as a whole, namely, a method which, simply by the addition of the irreducibly minimum number of redundant elements, renders the measurement system tolerant of failure.

Now, an embodiment of this invention in the current measurement system using optical CT's as illustrated in FIG. 5 will be described below.

Figure 7:
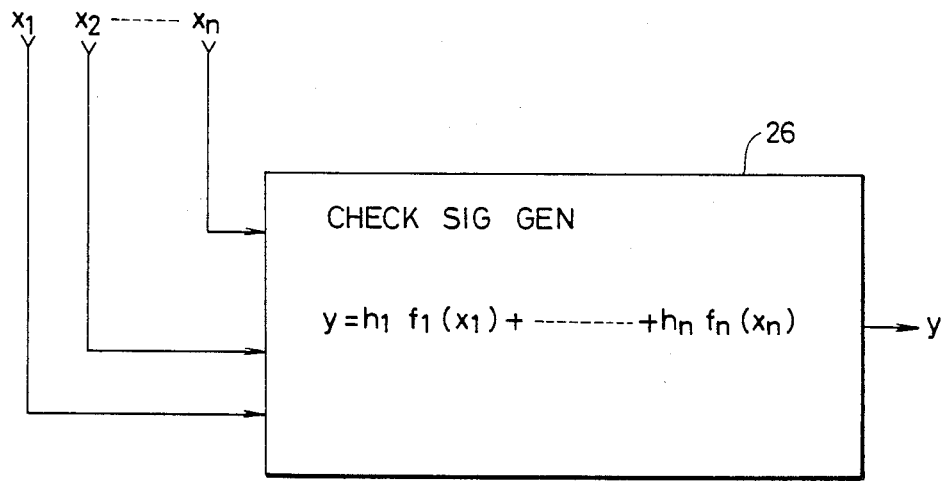
FIG. 7 is a diagram illustrating the concept of a check signal generator to be used for the purpose of this invention.

FIG. 7 is a diagram illustrating the concept of a check signal generator which constitues one essential element of this invention.

A check signal generator 26 is a functional element which produces a linear combination of functional values, $f_1(x_1)$ through $f_n(x_n)$, of the magnitudes of n physical quantities under measurement, namely, a signal y (hereinafter referred to as "check signal") represented by the following formula (5).

$$y = h_1 f_1(x_1) + \ldots + h_n f_n(x_n) \tag{5}$$

It is provided, however, that the functional formulas $f_i$ ($i = 1, 2, \ldots, n$) are already known.

For the purpose of rendering the measurement system used for measuring the currents $x_1$ through $x_3$, flowing through the three power transmission lines 91-93 as illustrated in FIG. 5, tolerant of failure, this invention generates a check signal represented by the following formula (5').

$$y = h_1 x_1 + h_2 x_2 + h_3 x_3 \tag{5'}$$

This formula is for the particular case in which the function $f_i$ of Formula (5) has a form shown below.

$$f_i(x) = x$$

A check signal generator which produces the check signal y of this formula (5') may be materialized in accordance with the principle of the optical CT illustrated in FIG. 3 through FIG. 5. One typical example of this check signal generator is illustrated in FIG. 8.

Figure 8:
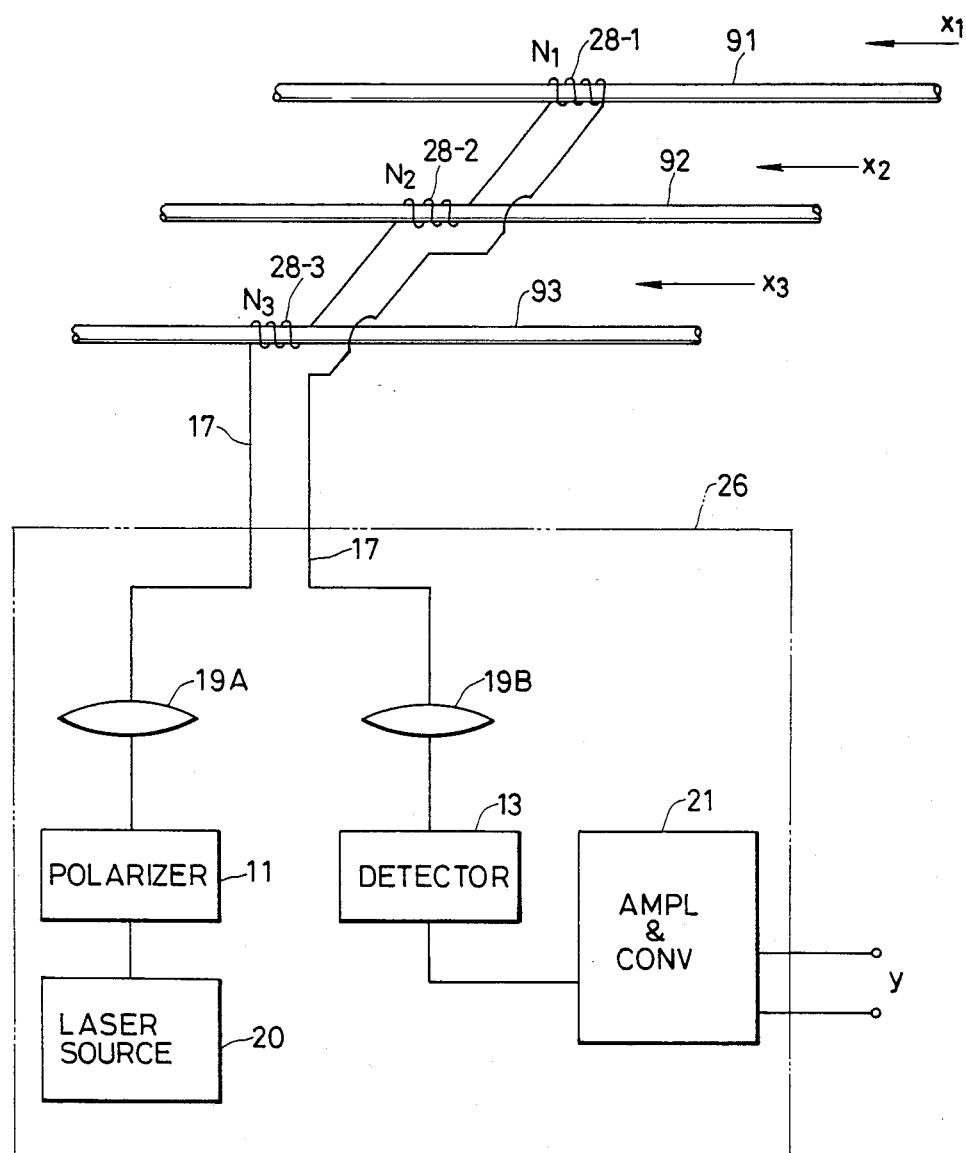
FIG. 8 is a block diagram showing the basic configuration of a check signal generator suitable for the purpose of this invention.

The check signal generator 26 of FIG. 8 has a configuration substantially indentical with that of an ordinary optical CT of FIG. 4. A sole difference resides in the fact that an optical fiber 17 is wound $N_1$, $N_2$, and $N_3$ turns, respectively, around the three power transmission lines 91, 92, and 93 to form three optical transducer units 28-1 through 28-3 which are serially formed on the optical fiber 17.

Figure 9:
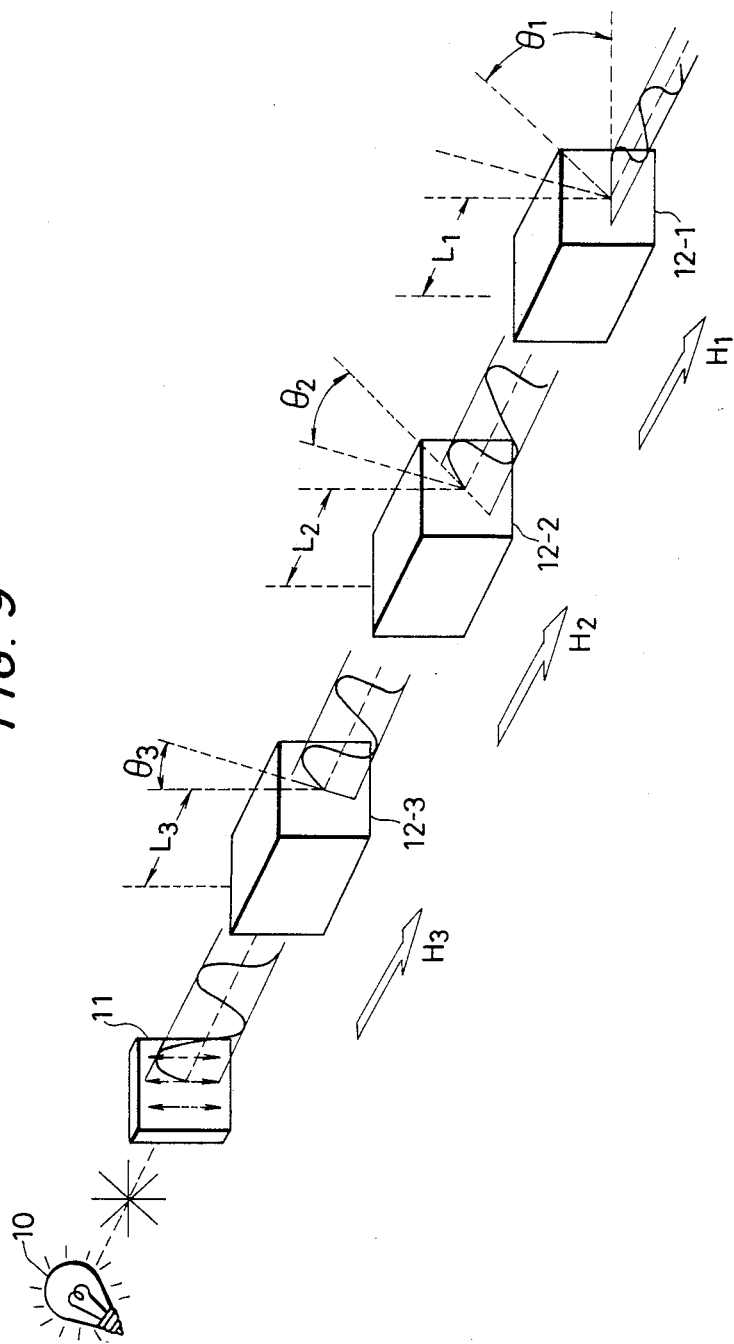
FIG. 9 is a perspective view illustrating a layout to be obtained by substituting the configuration of FIG. 8 with an optical measurement system.

FIG. 9 is a diagram which shows a layout having the configuration of FIG. 8 rearranged in the form of an optical measurement system.

Faraday rotators 12-1, 12-2, and 12-3 are disposed within magnetic fields $H_1$, $H_2$, and $H_3$ and a linearly polarized light from a light source 10 is allowed to advance parallelly to the direction of the aforementioned three magnetic fields and is passed through the Faraday rotators 12-1, 12-2, and 12-3. Consequently, the plane of light polarization is rotated by the respective angles of $\theta_1$, $\theta_2$, and $\theta_3$ by the three Faraday rotators.

In FIG. 8, the plane of polarization of light wave, at the optical transducer unit 28-3 related to the power transmission line 93, is rotated owing to the Faraday effect by an angle represented by the following formula (6).

$$\theta_3 = V_e L_3 H_3 \tag{6}$$

In this formula, $V_e$ denotes Verdet constant, $L_3$ the length of the optical fiber wound round the power transmission line 93, and $H_3$ the magnetic field produced by the current $X_3$. Similarly at the optical transducer units 28-2 and 28-1 related to the power transmission lines 92, 91, the Faraday effect causes the plane of polarization of light waves to be rotated by angles represented by the following formulas (7), (8).

$$\theta_2 = V_e L_2 H_2 \tag{7}$$

$$\theta_1 = V_e L_1 H_1 \tag{8}$$

Thus, the total angle, y, of rotation produced in the plan of polarization is expressed as follows.

$$y = \theta_1 + \theta_2 + \theta_3 \tag{9}$$

$$= V_e(L_1 H_1 + L_2 H_2 + L_3 H_3)$$

Here, the following relations are satisfied with respect to $j = 1, 2, 3$.

$$L_j = 2\pi R \cdot N_j \tag{10}$$

$$H_j = X_j / 2\pi R \tag{11}$$

The following formula (12) is consequently derived.

$$y = V_e(N_1 x_1 + N_2 x_2 + N_3 x_3) \tag{12}$$

Then, by assuming the following relation, (13), $$h_j = V_e N_j \ (j = 1, 2, 3) \tag{13}$$

the following formula is derived.

$$y = h_1 x_1 + h_2 x_2 + h_3 x_3 \tag{14}$$

The analysis demonstrated above proves that the check signal generator 26 can be specifically materialized in the configuration illustrated in FIG. 8. Moreover, as is noted from the foregoing formula (13), the size of the coefficient $h_j$ can be freely selected by suitably changing the numbers $N_j$, by which the optical fiber 17 is wound round the power transmission lines 91-93.

Figure 10:
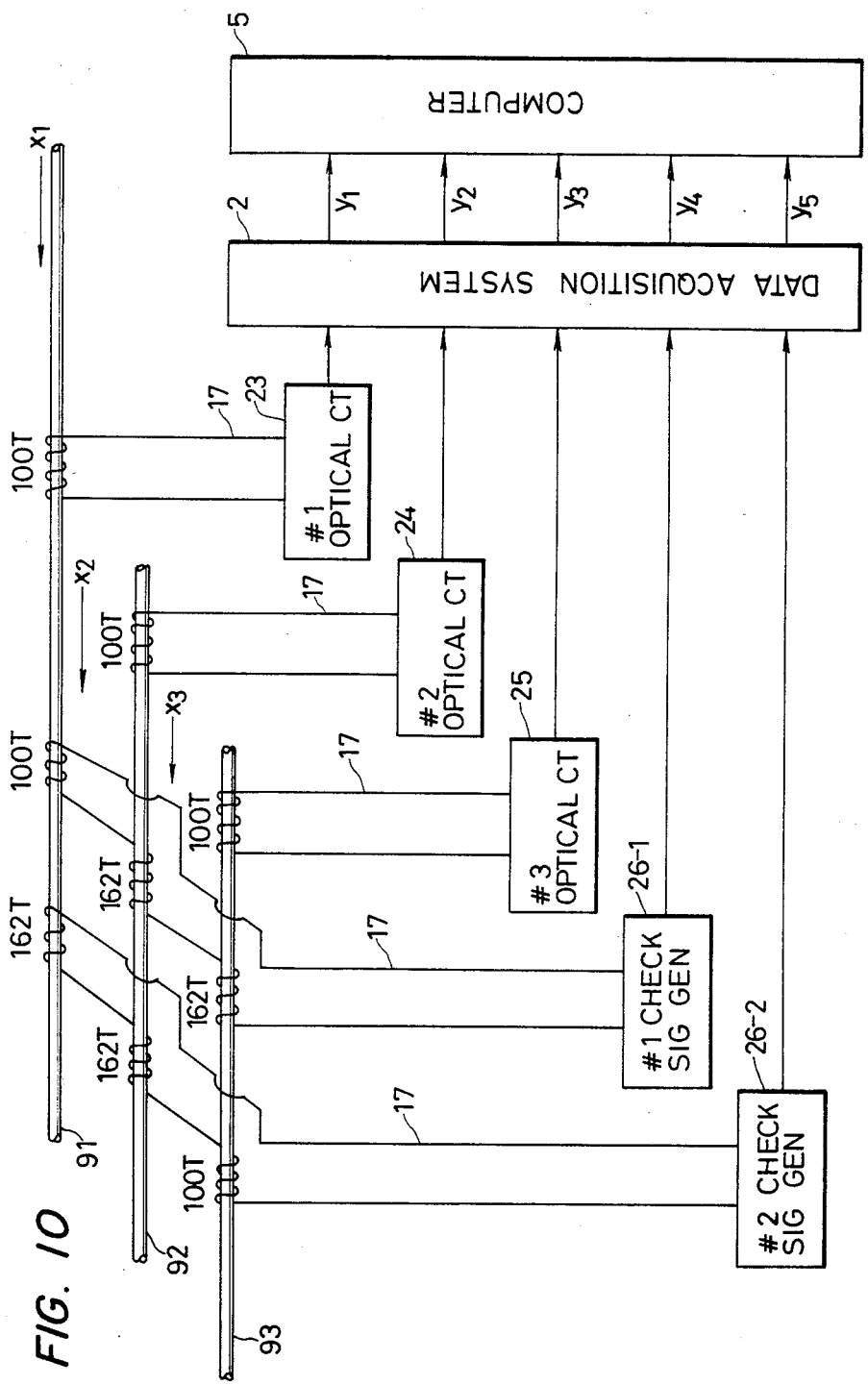
FIG. 10 is a block diagram of one embodiment of the present invention.

FIG. 10 is a block diagram illustrating an embodiment of this invention in a current measurement system.

This embodiment evidently is equivalent to the sum of the current measurement system of FIG. 5 plus two check signal generators 26 of the configuration of FIG. 8.

Now, on the assumption that optical fibers 17 corresponding to first through third optical CT's 23-25, are wound each 100 turns round the respective power transmission lines 91-93, the following formulas (15), (16), and (17) can be derived from the aforementioned formula (4).

$$y_1 = 100 V_e x_1 \tag{15}$$

$$y_2 = 100 V_e x_2 \tag{16}$$

$$y_3 = 100 V_e x_3 \tag{17}$$

It is further assumed that the optical fibers 17 corresponding to the check signal generators 26-1 and 26-2 are wound 162 turns and 100 turns round the power transmission lines 91–93 as illustrated. Then, the following formulas may be derived from the aforementioned formula (12).

$$y_4 = V_e(100x_1 + 162x_2 + 162x_3) \tag{18}$$

$$y_5 = V_e(162x_1 + 162x_2 + 100x_3) \tag{19}$$

From the formulas (15) through (19), it is noted that the following relations are established between $x_1$ through $x_3$ and $y_1$ through $y_5$.

$$\begin{bmatrix} y_1 \\ y_2 \\ y_3 \\ y_4 \\ -y_5 \end{bmatrix} = G \begin{bmatrix} 1 & 0 & 0 \\ 0 & 1 & 0 \\ 0 & 0 & 1 \\ 1.0 & 1.62 & 1.62 \\ -1.62 & -1.62 & -1.0 \end{bmatrix} \begin{bmatrix} x_1 \\ x_2 \\ x_3 \end{bmatrix} \tag{20}$$

$$G = 100 V_e \tag{21}$$

The minus sign (−) before $y_5$ in the aforementioned formula (20) signifies that when $y_5$ is fed in the computer 5, the computer reverses the sign of $y_5$.

The formula (20) shown above may be simply rewritten by using matrix and vector symbols as follows.

$$\dot{y} = \dot{H} \dot{x} \tag{22}$$
Where,
$$\dot{y} = [y_1, y_2, y_3, y_4, -y_5]^T$$

$$\dot{H} = G \begin{bmatrix} 1 & & \\ & 1 & \\ & & 1 \\ 1.0 & 1.62 & 1.62 \\ -1.62 & -1.62 & -1.0 \end{bmatrix}$$

$$\dot{x} = [x_1, x_2, x_3]^T$$

Here, the symbol T means that the expression indicated thereby is a transposed matrix.

If failure develops in the first through third optical CT's 23–25 or in the check signal generators 26-1, 26-2, errors $e_j$ (j = 1, 2, ..., 5) occur in the components of the vector $\dot{y}$. Consequently, the input $\tilde{y}$ actually fed at this time to the computer 5 is expressed in the following formula.

$$\tilde{y} = \dot{y} + [e_1, e_2, \ldots, e_5]^T \tag{23}$$

$$= \dot{H}\dot{x} + [e_1, e_2, \ldots e_5]^T$$

In consideration of the matrix $\dot{V}$ in the following formula (24), this matrix $\dot{V}$ will be hereinafter referred to as a "Parity check matrix."

$$\dot{V} = \begin{bmatrix} 0.63245, & 0.51167, & 0.19544, & 0.19544, & 0.51167 \\ 0 & 0.37175, & 0.60150, & -0.60150, & -0.37175 \end{bmatrix} = \tag{24}$$

$$[\dot{v}_1, \dot{v}_2, \dot{v}_3, \dot{v}_4, \dot{v}_5]$$

This matrix satisfies the following condition.

$$\dot{V} \dot{H} = 0 \tag{25}$$

Figure 11:
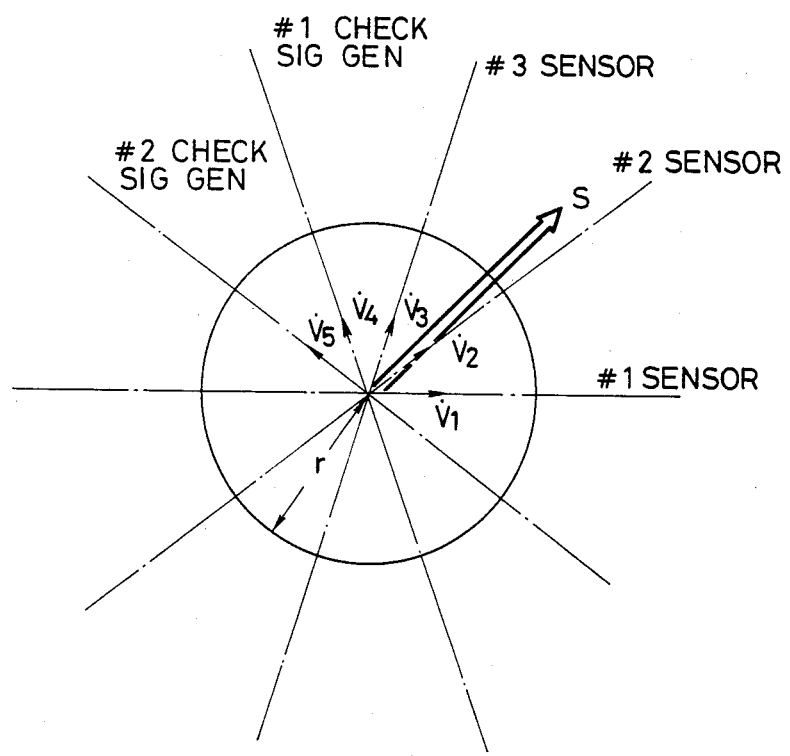
FIG. 11 is a diagram for illustrating the principle of the operation for identifying the site of failure in the present invention.

Further, the column vectors $\dot{v}_1$ through $\dot{v}_5$ in the parity check matrix $\dot{V}$ have those layouts shown in FIG. 11 in a two-dimensional plane. Specifically, the column vectors $\dot{v}_1$ through $\dot{v}_5$ are radially arranged as equiangularly spaced and their lengths are all equal.

Now, the principle of the operation for the identification of the site of fault in the embodiment of this invention will be described with reference to FIG. 11.

The two-dimensional vector S which is indispensable to the detection of fault is called "syndrome" which is defined by the following formula (26).

$$\dot{S} = \dot{V} \tilde{y} \tag{26}$$

This is a value which can be actually calcualted on the basis of the aforementioned matrix $\dot{V}$ and the measured vector $\dot{y}$ which has been actually fed into the computer 5.

It is further noted that the following formula is established by substituting the aforementioned formulas (23) and (25) in the formula (26) and rearranging the results.

$$\dot{S} = e_1 \dot{v}_1 + e_2 \dot{v}_2 + e_3 \dot{v}_3 + e_4 \dot{v}_4 + e_5 \dot{v}_5 \tag{27}$$

Evidently, it depends solely on the errors contained in outputs from the sensors and those from the check signal generators.

Here, it is presumed that two or more of the optical CT's and check signal generators do not go out of order all at once and that only the k'th signal $y_k$ is in trouble. Under the presumption, in the foregoing formula (23), since the error $e_k$ of the signal $y_k$ is particularly large and the errors $e_j$ of the other signals $y_j$ (j≠k) are nearly 0, the following formula (28) is established from the aforementioned formula (27).

$$\dot{S} = e_k \dot{v}_k \tag{28}$$

Let $\delta = |e_k|$ stands for the size of the error of the signal $y_k$, and it will be noted from the aforementioned formula (28) that the length $\dot{S}$ of the syndrome during the development of fault, can be expressed by the following formula (29) and the syndrome extends in the direction of $V_k$.

$$\|\dot{S}\| = \|\dot{v}_k\| |\delta| = \sqrt{\frac{2}{5}} |\delta| \tag{29}$$

When the syndrome $\dot{S}$ goes out of the circle of a radius r (which is a threshold value fixed in advance) around the origin as its center in the two-dimensional plane as illustrated in FIG. 11, it serves as a sign by which the fault is detected. In this case, it can be judged that the optical CT or check signal generator which corresponds to the vector $v_k$ giving the longest projection of the syndrome S is in trouble. In this manner, the detection of fault and the identification of the site of fault (direction of $v_k$) can be accomplished.

In accordance with the principle described with reference to FIG. 11, the computer 5 in the embodiment of FIG. 10 effects necessary processing as illustrated in the flow chart of FIG. 12.

Figure 12:
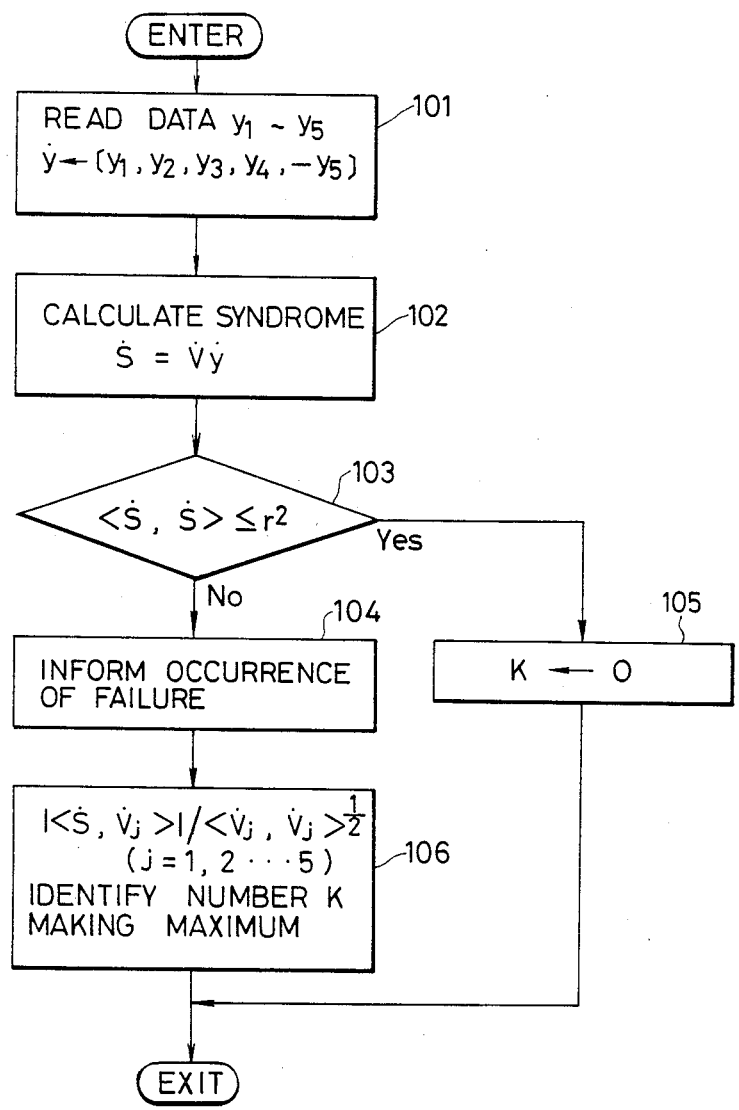
FIG. 12 is a flow chart of the operation for the identification of the site of failure in the embodiment of this invention.

At the step 101 in the process flow of FIG. 12, the measured values $y_1$, $y_2$, and $y_3$ and the check signals $y_4$ and $y_5$ are fed into the computer 5 via the data acquisition system 2 (FIG. 10) and the vector $\dot{y}$ is calculated in accordance with the following formula (30).

$$\dot{y} = [y_1, y_2, y_3, y_4, -y_5]^T \tag{30}$$

At the step 102, the syndrome $\dot{S}$ which is a two-dimensional vector is calculated from the aforementioned vector $\dot{y}$ in accordance with the following formula (31).

$$\dot{S} = \dot{V}\dot{y} \tag{31}$$

The matrix $\dot{V}$ in this formula represents the parity check matrix of the aforementioned formula (24).

At the step 103, to detect the occurrence of fault, if any, the positive number r fixed in advance is compared with the length of the syndrome $\dot{S}$. The presence of fault in the system is reported when the comparison shows the length of the syndrome $\dot{S}$ to exceed the preset value r. In a concrete form, the inner product of the vectors $\dot{S}$, $\dot{S}$, i.e. $<\dot{S}, \dot{S}>$, is calculated at this step. The system is reported as normally operating when the aforementioned inner product $<\dot{S}, \dot{S}>$ is smaller than the value of $r^2$. In this case, to display the normality of operation, the processing is advanced to the next step 105, there to be terminated by setting K to 0. The presence of fault is reported when the inner product $<\dot{S}, \dot{S}>$ is greater than the value of $r^2$. In this case, the processing is advanced to the step 104 to display the occurrence of fault.

At the step 106, the processing effects identification of the site of fault. To be specific, the length of the projection of the syndrome $\dot{S}$ upon the column vector $\dot{v}_j$ ($j=1, 2, \ldots, 5$) in the parity check matrix $\dot{V}$ is calculated in accordance with the following formula (32) to find the particular number K which gives the maximum value. Evidently in this case, if the number K thus determined is any of 1 to 3, this fact means that the optical CT bearing that particular number is in trouble. If the number K is found to be either 4 or 5, this fact means that the check signal generator bearing that particular number is in trouble. In this connection, it should be noted that the diagram of FIG. 11 is illustrated as involving fault in the sensor #2.

$$\frac{|<\dot{S}, \dot{v}_j>|}{<\dot{v}_j, \dot{v}_j>^{\frac{1}{2}}} \quad (j = 1, 2, \ldots 5) \tag{32}$$

The principle of the computer program which, upon occurrence of fault in the system, effects detection of fault and identification of the site of fault in accordance with the measured values and the issued check signal and the working of the processing involved in the program have been described.

Figure 13:
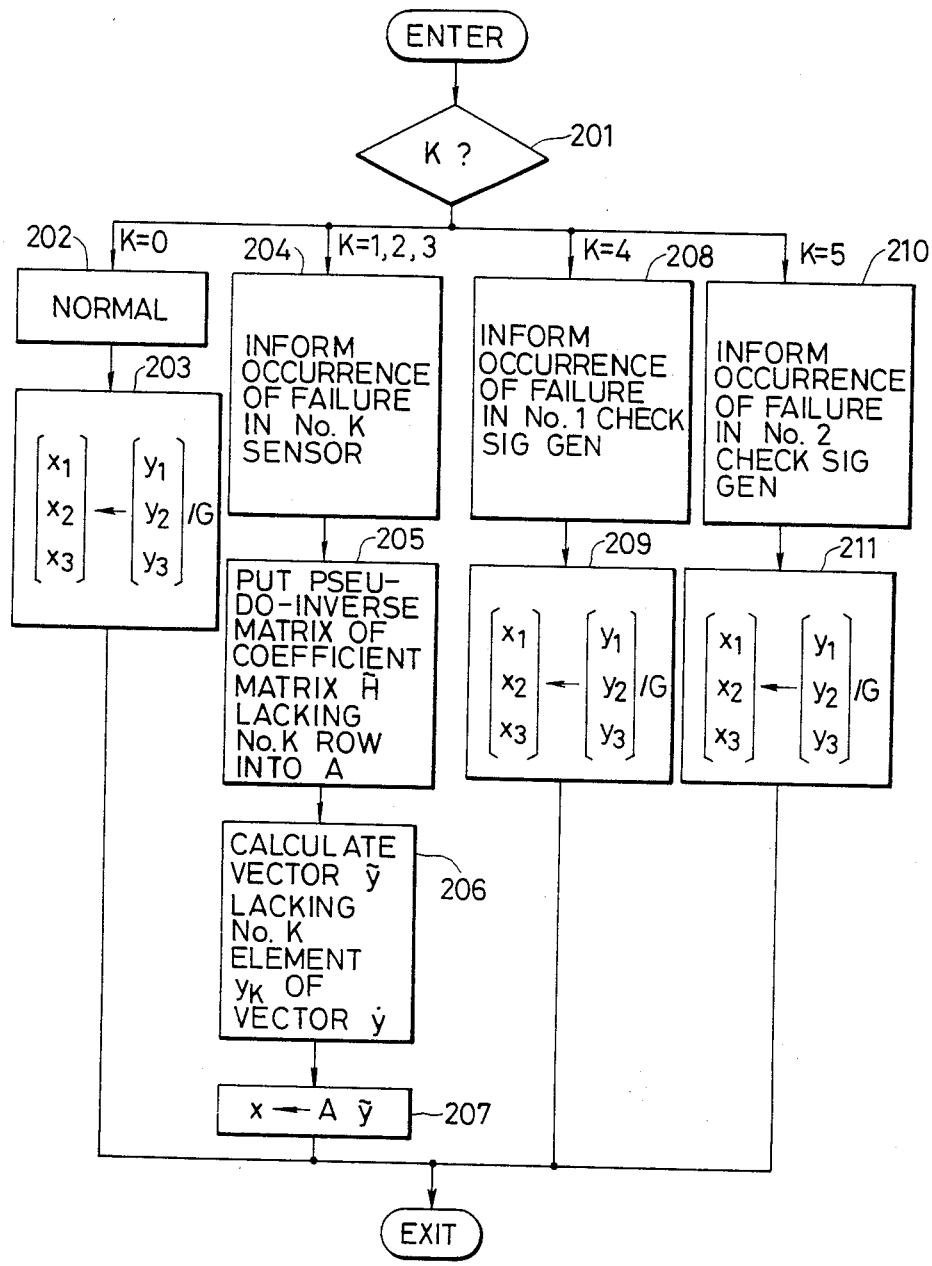
FIG. 13 is a flow chart of a computer program to be executed subsequently to the operation of FIG. 12 for obtaining the correct magnitudes, $x_1$ through $x_3$, of the electric current in the power transmission line.

FIG. 13 is a flow chart of the processing of the computer program which is executed subsequently to the processing of FIG. 12 for determining the correct values ($x_1$ through $x_3$) of the currents flowing through the power transmission lines.

The process flow illustrated here includes a procedure to remedy fault occurring within the system so that correct magnitudes of the currents flowing in the three power transmission lines may be obtained even during the presence of fault, let alone the period free from fault.

At the step 201, the processing is branched off in accordance with the results of the execution of the computer program of FIG. 12, i.e. the result K of the identification of fault.

When K is found to be 0, the processing is advanced to the step 202 to display the absence of fault. At this time, since the values $y_1$ through $y_3$, measured by the optical CT's 23 through 25 are correct, the values $x_1$ through $x_3$ of the currents flowing through the power transmission lines 91 through 93 are correctly decided by the processing of substitution of the matrix [$y_1$, $y_2$, $y_3$]$^T$/G into the matrix [$x_1$, $x_2$, $x_3$]$^T$ at the step 203. Consequently, the processing is terminated there.

When K is found to be any of 1, 2, and 3, this fact indicates that one of the optical CT's 23 through 24 which bears the particular number of K is in trouble. In other words, one of the measured values $y_k$ of the power transmission lines 91 through 93 (having the particular number of K) is not giving a correct magnitude $x_k$ of the current. At the steps 204 through 207, therefore, the aforementioned value $x_k$ is calculated from the measured values and the check signals which exclude those corresponding to the particular measured value $y_k$ involving the error in question.

Now, the principle of this part of processing will be described below. If the result K, of the identification of fault happens to be 1, the following formula (33) of simultaneous linear equations will be obtained from the aforementioned formula (20).

$$\begin{bmatrix} y_2 \\ y_3 \\ y_4 \\ y_5 \end{bmatrix} = G \begin{bmatrix} 0 & 1 & 0 \\ 0 & 0 & 1 \\ 1.0 & 1.62 & 1.62 \\ -1.62 & -1.62 & -1.0 \end{bmatrix} \begin{bmatrix} x_1 \\ x_2 \\ x_3 \end{bmatrix} \tag{33}$$

Evidently, the simultaneous linear equations of the foregoing formula (33) have a unique solution. By multiplying the pseudo-inverse matrix of coefficient matrix into the vectors $y_2 \sim y_5$ in the formula (33), the value of $x_1$ can be calculated. When K is found to be 2 or 3, the value of $x_2$ of $x_3$ can be calculated in entirely the same way.

In accordance with the principle described above, the presence of fault in the k'th optical CT is reported at the step 204 and, subsequently, an arithmetic operation is performed for the pseudo-inverse matrix of the matrix $\widetilde{H}$ of four rows and 3 columns resulting from exclusion of the k'th row from the coefficient matrix $\widetilde{H}$. The outcome of the calculation is replaced as A. The arithmetic operation may be carried out as shown below, for example.

$$A \leftarrow (\widetilde{H}^T\widetilde{H})^{-1}\widetilde{H}^T \tag{34}$$

Actually, the calculation of the righthand member of this formula is complicated and calls for much time. The trouble may be avoided by performing this arithmetic operation in advance, storing the results of the calculation in a suitable memory, and keeping this memory ready for desired retrieval of relevant data therefrom at any time.

At the step 206, the vector $\tilde{y}$ which excludes the k'th measured value $y_k$ which has been found to be erroneous is produced from the vector $\dot{y}$.

At the step 207, the magnitudes of electric currents, $\dot{x}=(x_1, x_2, x_3)^T$, flowing through the power transmission lines 91 through 93 are calculated by multiplying the vector $\tilde{y}$ by the pseudo-inverse matrix A. Specifically, this calculation is carried out as shown by the formula (35) below.

$$\dot{x} = A\tilde{y} \quad (35)$$

Then, when K is found to be 4, the processing advances to the step 208, at which the presence of fault at the first check signal generator 26-1 is reported. In this case, since the measured values $y_1$ through $y_3$ given by the optical CT's 23 through 25 give correct magntudes $x_1$ through $x_3$, of the currents flowing through the power transmission lines, the following part of processing is carried out at the step 209. This part of processing is similar to that performed at the step 203 explained above.

$$[x_1, x_2, x_3]^T \leftarrow [y_1, y_2, y_3]^T/G$$

When K is found to be 5, the processing advances to the step 210, at which the presence of fault at the second check signal generator 26-2 is reported. Again in this case, the processing of the step 211 is carried out for the same reason as in the case of K=4.

$$[x_1, x_2, x_3]^T \leftarrow [y_1, y_2, y_3]^T/G$$

When the processing by the computer program shown in FIG. 12 and FIG. 13 is carried out in the system of the configuration illustrated in FIG. 10, the current measurement system of FIG. 5 utilizing optical CT's can be rendered tolerant of the fault in sensors (optical CT's).

Figure 14:
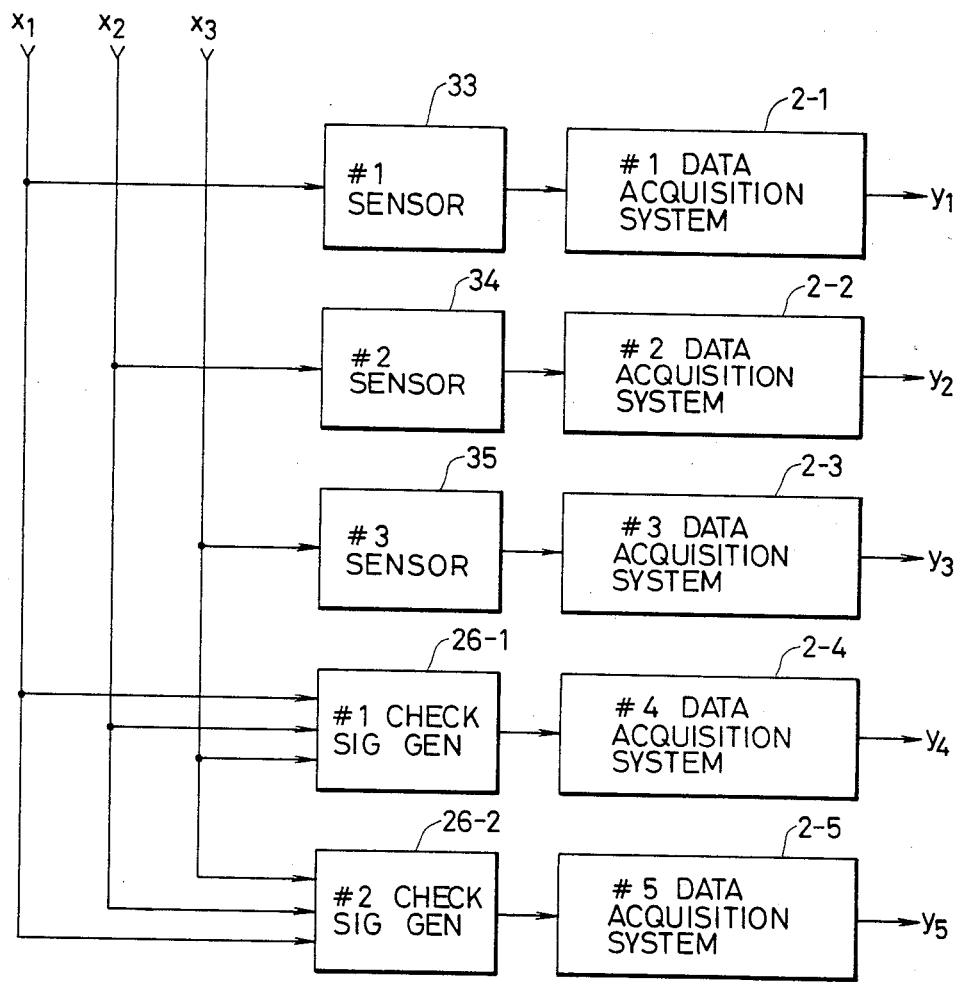
FIG. 14 is a block diagram illustrating the second embodiment of this invention.

FIG. 14 is a block diagram which illustrates another embodiment of this invention in a measuring system rendered tolerant of fault. From the diagram, it is noted that, in this embodiment, the data acquisition systems 2 serve the respective sensors independently. Thus, the measurement system can be rendered tolerant of fault by executing the computer program of FIG. 12 and FIG. 13 even when fault occurs in any one of the data acquisition systems 2-1, 2-2, 2-3, 2-4, and 2-5, to say nothing of the case in which fault occurs in the sensors 33 through 35 and the check signal generators 26-1 and 26-2. This fact may be easily understood by regarding the sensors 33, 34, 35, 26-1, and 26-2 as being respectively paired off with the data acquisition systems 2-1 through 2-5 to form a total of five sets of sensors. Such independent installation of the five data acquisition systems, however, entails a large addition to the cost of equipment. To keep down the cost, therefore, it is desirable that these systems should be designed to share an A/D converter and other component elements through the medium of an analog multiplexer and should be consequently used on a time-shared mode.

Figure 15:
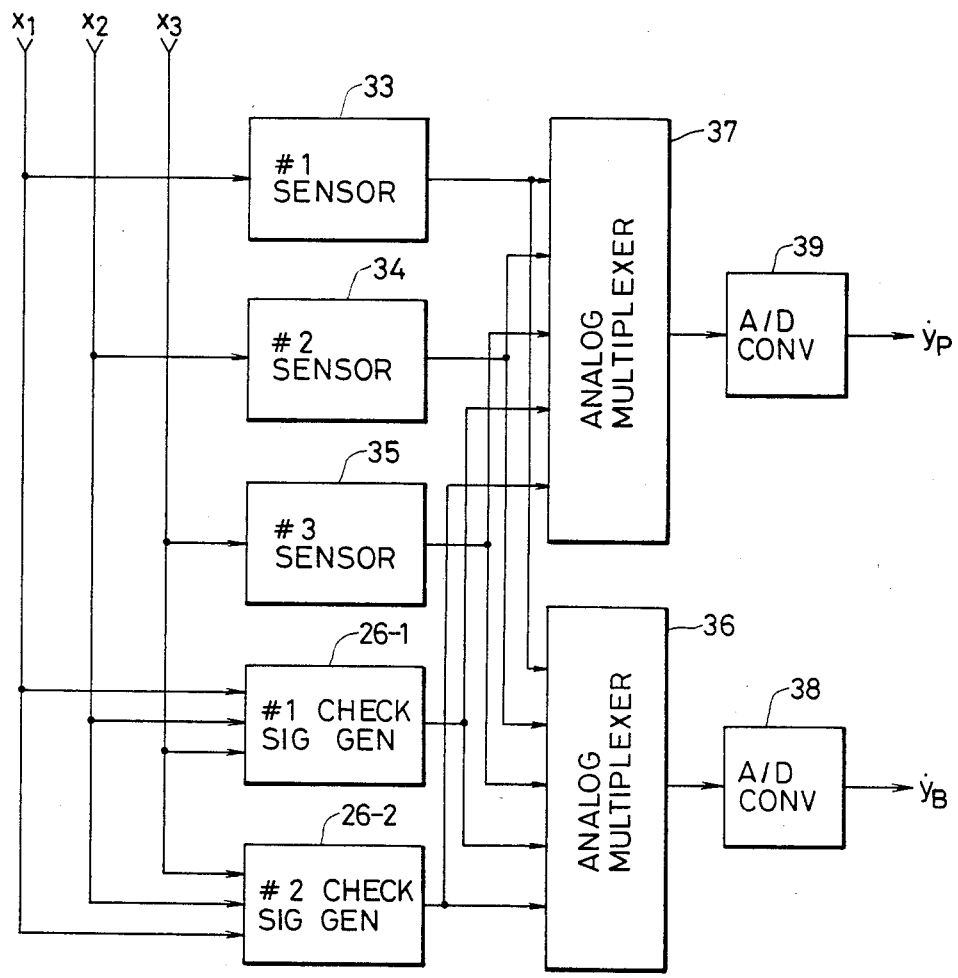
FIG. 15 is a block diagram illustrating the third embodiment of this invention.

FIG. 15 is a block diagram which illustrates yet another embodiment of this invention in a measuring system rendered tolerant of fault, and modified to be operated on a time-shared mode as described above.

In this embodiment, the sensors 33 through 35 and the check signal generator sensors 26-1 and 26-2 are designed to share A/D converters 38, 39 through the medium of analog multiplexers 36, 37 so as to materialize the aforementioned time-shared processing. In the arrangement of FIG. 15, the similar component elements subsequent to the analog multiplexers are invariably paired in dual form.

One of the dualized data acquisition systems (consisting of respectively paired multiplexers 36, 37 and A/D converters 38, 39) will be called a "primary system" and the other a "secondary system" and their outputs will be called $\dot{y}_P$, $\dot{y}_B$. In this case, the following additional processing will be executed before the computer program of FIG. 12 and FIG. 13. First, the syndrome $S_P$ based on the output $\dot{y}_P$ of the primary system and the syndrome $S_B$ based on the output $\dot{y}_B$ of the secondary system will be calcualted.

Now, the processing will be considered below with respect to the following four cases.

(1) $\|S_P\| < r$ and $\|S_B\| < r$ are satsified:

Since the measurement system is normal, correct magnitudes $x_1$ through $x_3$, of electric currents are obtained by executing the computer program of FIG. 12 and FIG. 13, with the output $\dot{y}_P$ of the primary system used as the input.

(2) When $\|S_P\| > r$ and $\|S_B\| < r$ are satisfied:

Since fault is present in the data acquisition system of the primary system, this fact is reported. Correct magnitudes $x_1$ through $x_3$, of electric currents are obtained by subsequently executing the computer program of FIG. 12 and FIG. 13, with the output $\dot{y}_B$ of the secondary system used as the input.

(3) When $\|S_P\| < r$ and $\|S_B\| > r$ are satisfied:

Since fault is present in the data acquisition system of the secondary system, this fact is reported. Correct magnitudes $x_1$ through $x_3$, of electric currents are obtained by subsequently executing the computer program of FIG. 12 and FIG. 13, with the output $\dot{y}_P$ of the primary system used as the input.

(4) When $\|S_P\| > r$ and $\|S_B\| > r$ are satisfied:

This occurs when fault is present in any of the sensors 33 through 35, 26-1, and 26-2. The sensor in trouble is identified by executing the computer program of FIG. 12, with the output $\dot{y}_P$ of the primary system used as the input. Correct magnitudes $x_1$ through $x_3$, of electric currents are obtained by subsequently executing the computer program of FIG. 13.

Figure 16:
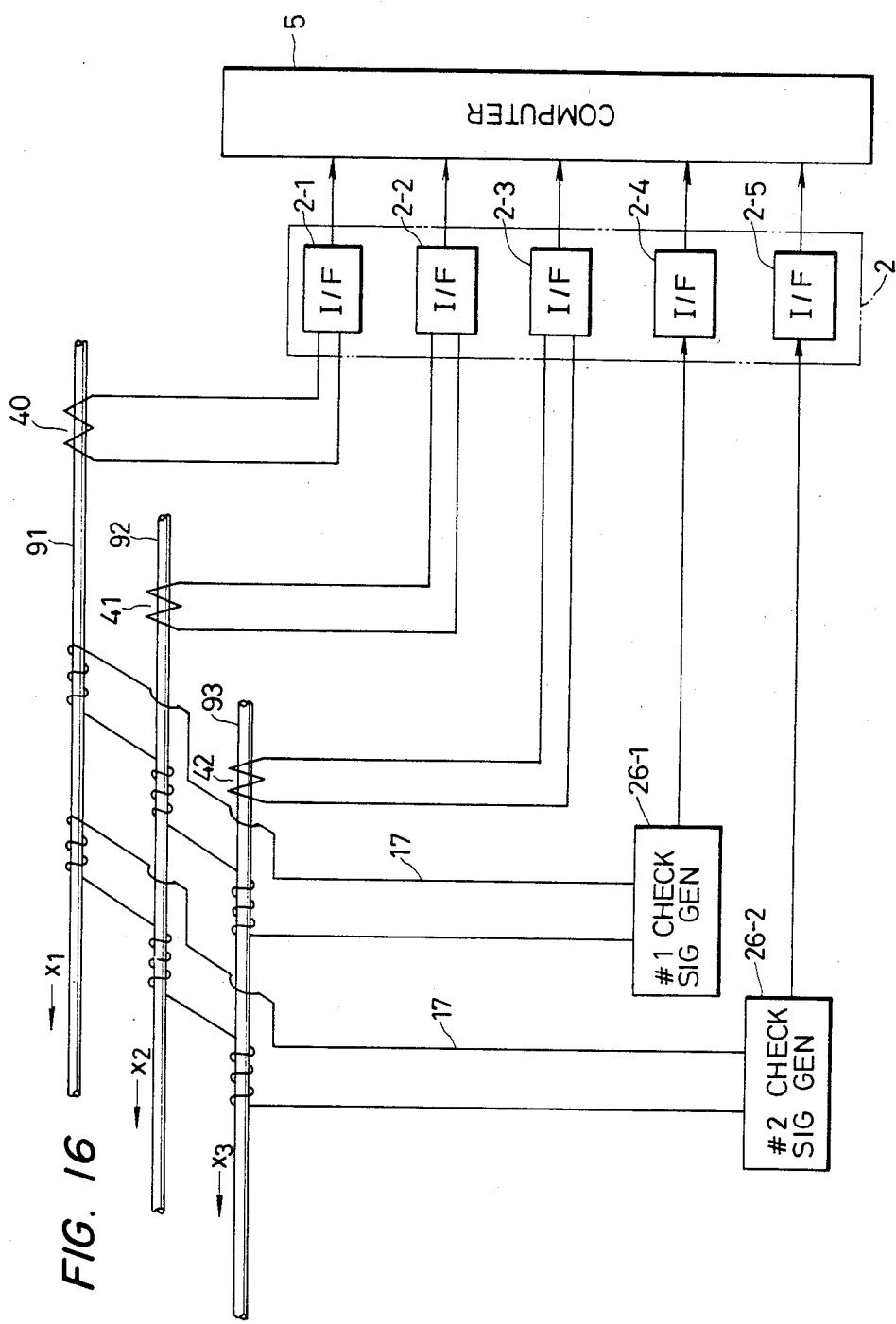
FIG. 16 is a block diagram illustrating the fourth embodiment of this invention.

FIG. 16 is a block diagram which illustrates a further embodiment of this invention.

In this embodiment, this invention is applied to the current measurement system using conventional electromagnetic CT's. In this embodiment, two check signal generators 26 of FIG. 10 are added to a measurement system which is designed to measure the magnitudes of electric currents flowing through three power transmission lines 91 through 93 with three electromagnetic CT's 40 through 42 and feed the measured values into a computer 5 via data acquisition systems 2-1 through 2-3 provided respectively for the CT's. In this arrangement, the magnitudes $x_1$ through $x_3$, of electric currents flowing through the power transmission lines 91 through 93, the measured values $y_1$ through $y_3$, and the check signals $y_4$ and $y_5$, are enabled to satisfy the relation of the aforementioned formula (20) by adjusting the gains of the amplifiers within the data acquisition system 2-1 through 2-5, for example. By the combination of the system configuration of FIG. 16 with the computer program of FIG. 12 and FIG. 13, therefore, a current measurement system utilizing electromagnetic CT's can be rendered tolerant of fault. As demonstrated above, the sensors in a measurement system which has not yet been rendered tolerant of fault are not required by any reason at all to be those utilizing optical fibers. Conversely, it is evidently permissible for the check signal generators to be formed of an electromagnetic CT.

The two embodiments so far described have been directed to rendering current measurement systems tolerant of fault. Similarly, a check signal generator intended for some other physical quantity than electric current can be materialized in a configuration similar to the configuration of FIG. 8.

For example, (a) a check signal generator for use in a temperature measurement system resorting to the phenomenon of energy gap in a semiconductor crystal, (b) a check signal generator for use in an electric field measuring system resorting to Pockels effect, and (c) a check signal generator for use in a pressure measurement system resorting to the photoelastic effect can be materialized.

The method by which check signal generators can be formed of sensors utilizing optical fibers has been described. There are various other methods available for the formation of such check signal generators. As a typical example, a check signal generator for temperature measurement which makes use of a thermoresistor (RTD) will be described below.

The thermoresistor (RTD) is a transducer for temperature measurement which converts a given temperature to a corresponding magnitude of electric resistance. The magnitude of electric resistance $y(x)$, corresponding to the temperature $x$, is expressed by the following formula.

$$y(x) = R_0(1 + \alpha x + \beta x^2) = R_0 f(x) \quad (36)$$

In this formula, $R_0$ denotes the magnitude of resistance at 0° C., of the thermoresistor, which is called "nominal resistance," and $\alpha$ and $\beta$ are known coefficients which are determined by the particular material (such as platinum) of which the thermoresistor is made.

Figure 17:
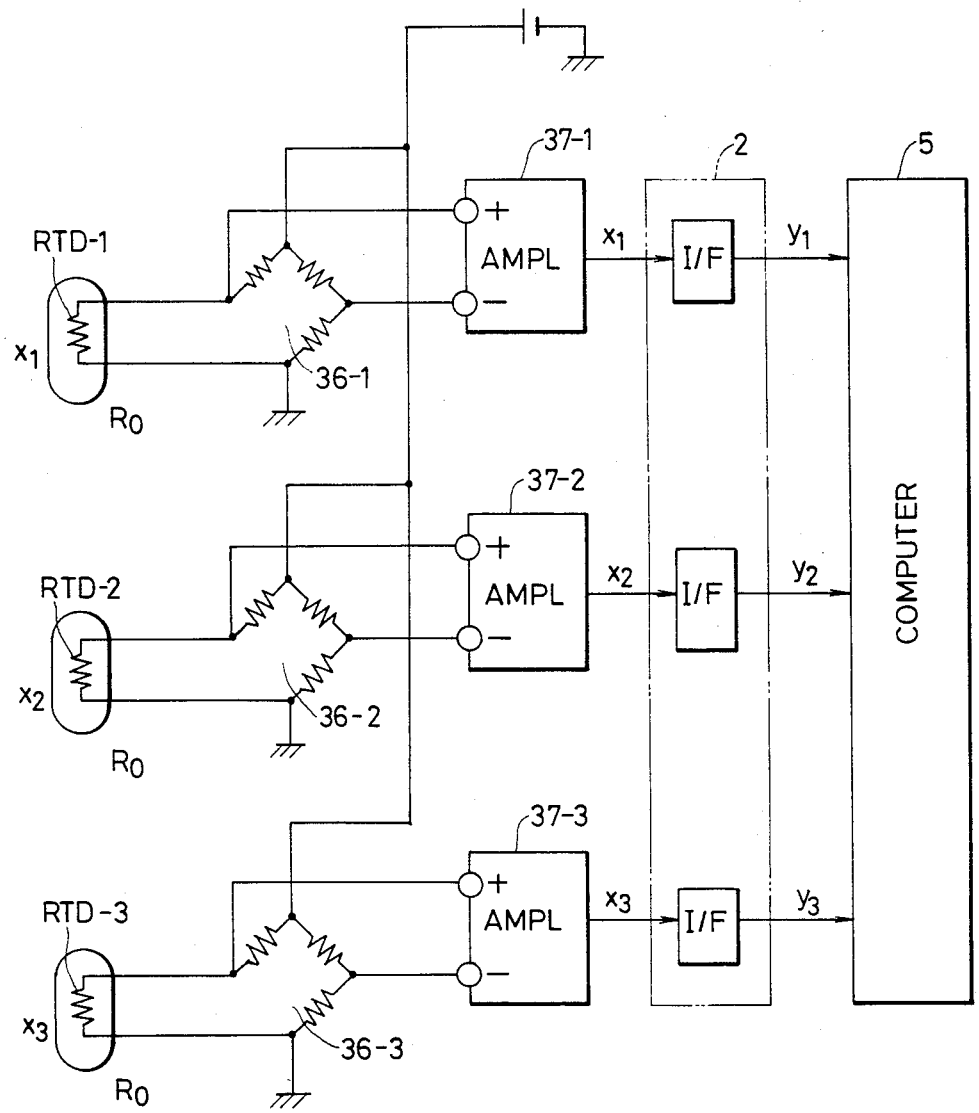
FIG. 17 is a diagram illustrating a basic configuration of the conventional multi-point temperature measuring system using thermoresistance temperature sensors.

FIG. 17 is a diagram illustrating the concept of a measurement system designed to take measurement of temperatures $x_1$ through $x_3$, at three points. In this arrangement, the temperatures $x_1$ through $x_3$, are converted by thermoresistors RTD-1 through RTD-3 into corresponding resistance $y(x_1)$, $y(x_2)$, and $y(x_3)$, and subsequently converted by corresponding bridge circuits 36-1 through 36-3 into voltages. Then, these voltages are amplified by differential amplifiers 37-1 through 37-3 and are subsequently fed as measured values $y_1$, $y_2$, and $y_3$, to a computer 5. The computer 5 calculates the magnitudes $y(x_1)$ through $y(x_3)$ of resistance from the measured values (voltage signals) of $y_1$ through $y_3$, and recalculates the temperatures $x_1$ through $x_3$, from the calculated magnitudes of resistance.

Figure 18:
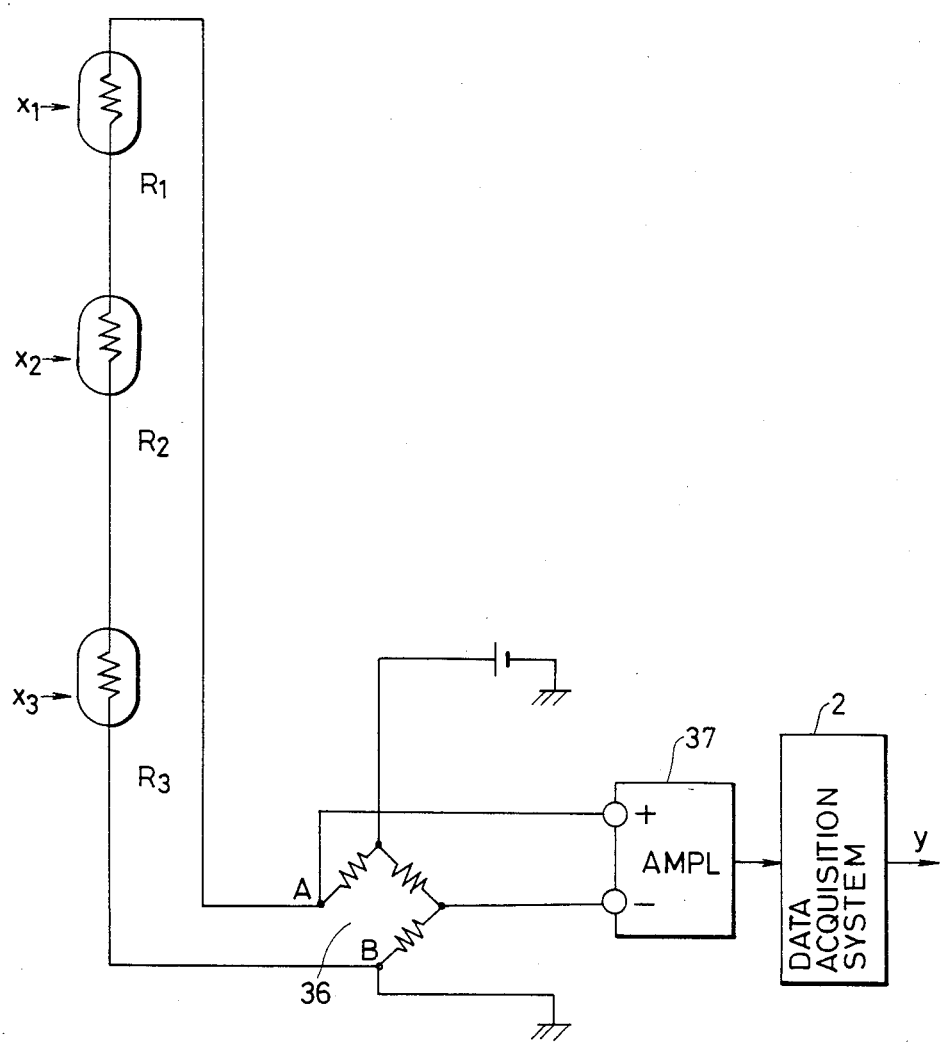
FIG. 18 is a diagram illustrating a basic configuration of a check signal generator making use of a thermoresistor and befitting application to the present invention.

FIG. 18 is a diagram illustrating the concept of a check signal generator to be used for rendering the measurement system of FIG. 17 tolerant of fault. This configuration is nearly equal to the unit construction of an ordinary temperature sensor. A sole difference resides in the fact that one arm (measuring arm) of the bridge 36 is formed of a circuit which has serially connected therein three thermoresistors $R_1$, and $R_2$, and $R_3$, disposed one each at three sites of temperature measurement. Let $R_1$, $R_2$, and $R_3$ stand for the values of nominal resistance of the three thermoresistors, and the value of combined resistance $R_y$, will be found by the following formula (37).

$$R_y = R_1 f(x_1) + R_2 f(x_2) + R_3 f(x_3) \quad (37)$$

wherein, $$f(x) = 1 + \alpha x + \beta x^2$$

The signal $R_y$ turns out to be the check signal defined by the formula (5).

Figure 19:
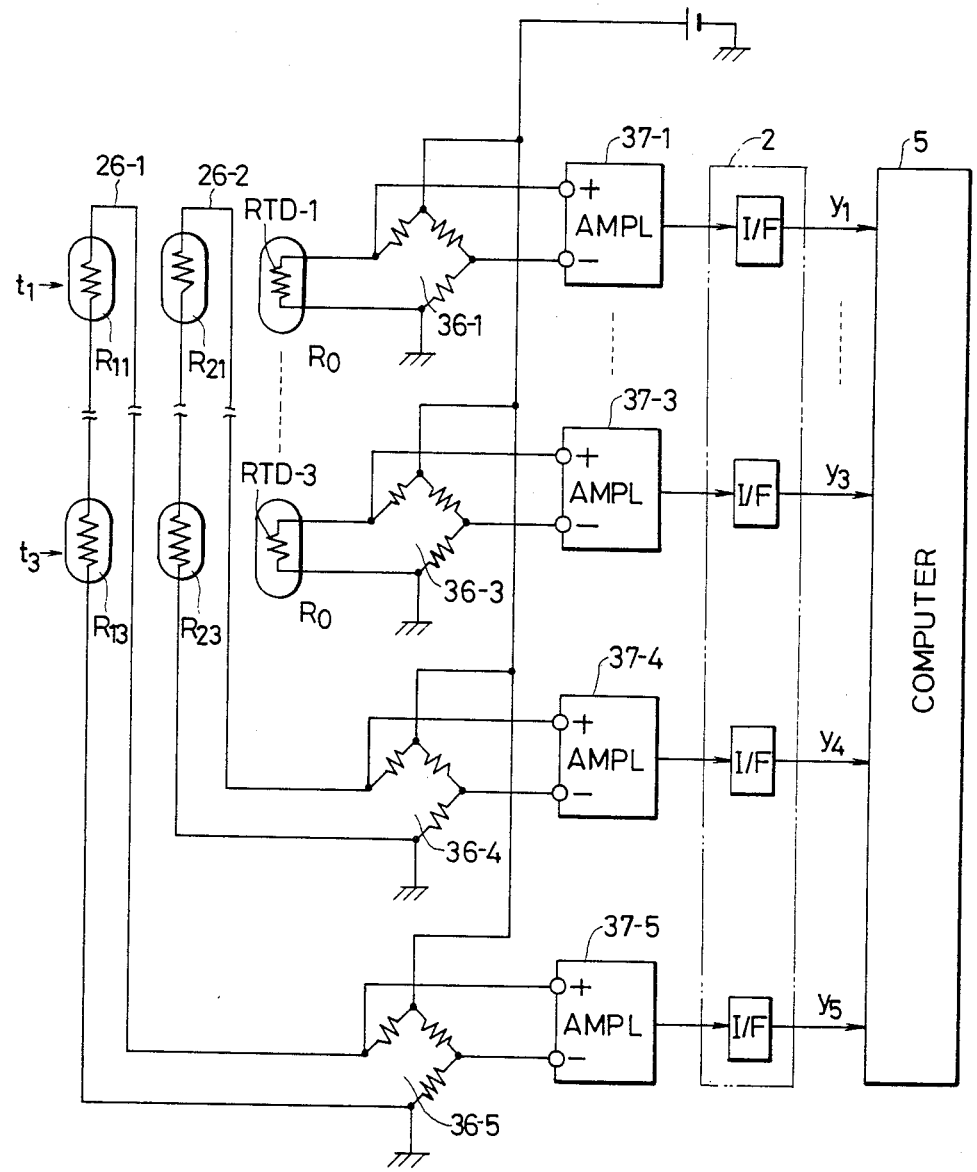
FIG. 19 is a block diagram illustrating the fifth embodiment of this invention.

FIG. 19 is a block diagram which illustrates this invention as embodied in rendering the measurement system of FIG. 17 tolerant of fault by use of two check signal generators 26 of FIG. 18.

By the fixation of a nominal value of resistance (denoted by $R_0$), the measured values $R_{y1}$ through $R_{y3}$, obtained by the thermoresistors RTD-1 through RTD-3 of the three temperature sensors can be made to satisfy the following formula (38).

$$\begin{aligned}R_{y1} &= R_0 f(x_1)\\ R_{y2} &= R_0 f(x_2)\\ R_{y3} &= R_0 f(x_3),\end{aligned} \quad (38)$$

When the nominal values of resistance of the serially arranged thermoresistors $R_{11}$ through $R_{13}$ and $R_{21}$ through $R_{23}$ are selected so as to establish the following relations:

$$R_{11} = R_0$$

$$R_{12} = 1.62 R_0$$

$$R_{13} = 1.62 R_0$$

$$R_{21} = 1.62 R_0$$

$$R_{22} = 1.62 R_0$$

$$R_{23} = R_0$$

the check signals (combined magnitudes of resistance in the present case) produced by the first and second check signal generators 26-1 and 26-2 can be represented by the following formula (39).

$$\begin{aligned}R_{y4} &= R_0\{f(x_1) + 1.62 f(x_2) + 1.62 f(x_3)\}\\ R_{y5} &= R_0\{1.62 f(x_1) + 1.62 f(x_2) + f(x_3)\}\end{aligned} \quad (39)$$

From the foregoing formulas (38) and (39), it is noted that the relation of the following formula (40) exists among $f(x_1) \sim f(x_3)$ and $R_{y1} \sim R_{y5}$.

$$\begin{bmatrix} R_{y1} \\ R_{y2} \\ R_{y3} \\ R_{y4} \\ -R_{y5} \end{bmatrix} = R_0 \begin{bmatrix} 1 & 0 & 0 \\ 0 & 1 & 0 \\ 0 & 0 & 1 \\ 1.0 & 1.62 & 1.62 \\ -1.62 & -1.62 & -1.0 \end{bmatrix} \begin{bmatrix} f(x_1) \\ f(x_2) \\ f(x_3) \end{bmatrix} \quad (40)$$

When the following equations are substituted in the formula (40), $$X_j = f(x_j)$$

$$R_0 = G$$

$$R_{yj} = y_j$$

wherein, $j=1, 2, 3$, it is found that the formula (40) is completely identical with the aforementioned formula (20).

By executing the program of FIG. 12 and FIG. 13 with the computer 5, therefore, correct values of $X_j$, namely, correct values of $f(x_j)$, can be found even when fault develops in part of the component elements of FIG. 19 such as, for example, any of the differential amplifiers. Thus, correct magnitudes of temperature $x_j$, can be found.

The methods by which check signal generators are formed by using optical fibers or thermoresistors have been described. Such check signal generators may otherwise be obtained by using other detection devices such as, for example, thermocouples or strain gauges.

The embodiments so far described represent cases in which this invention is applied to systems for measuring physical quantities by using detection devices of a fixed type. The present invention is not limited to this particular mode of using detection devices. It can be applied to systems designed to effect measurement of physical quantities of different kinds by the use of detection devices of dissimilar types.

Figure 22:
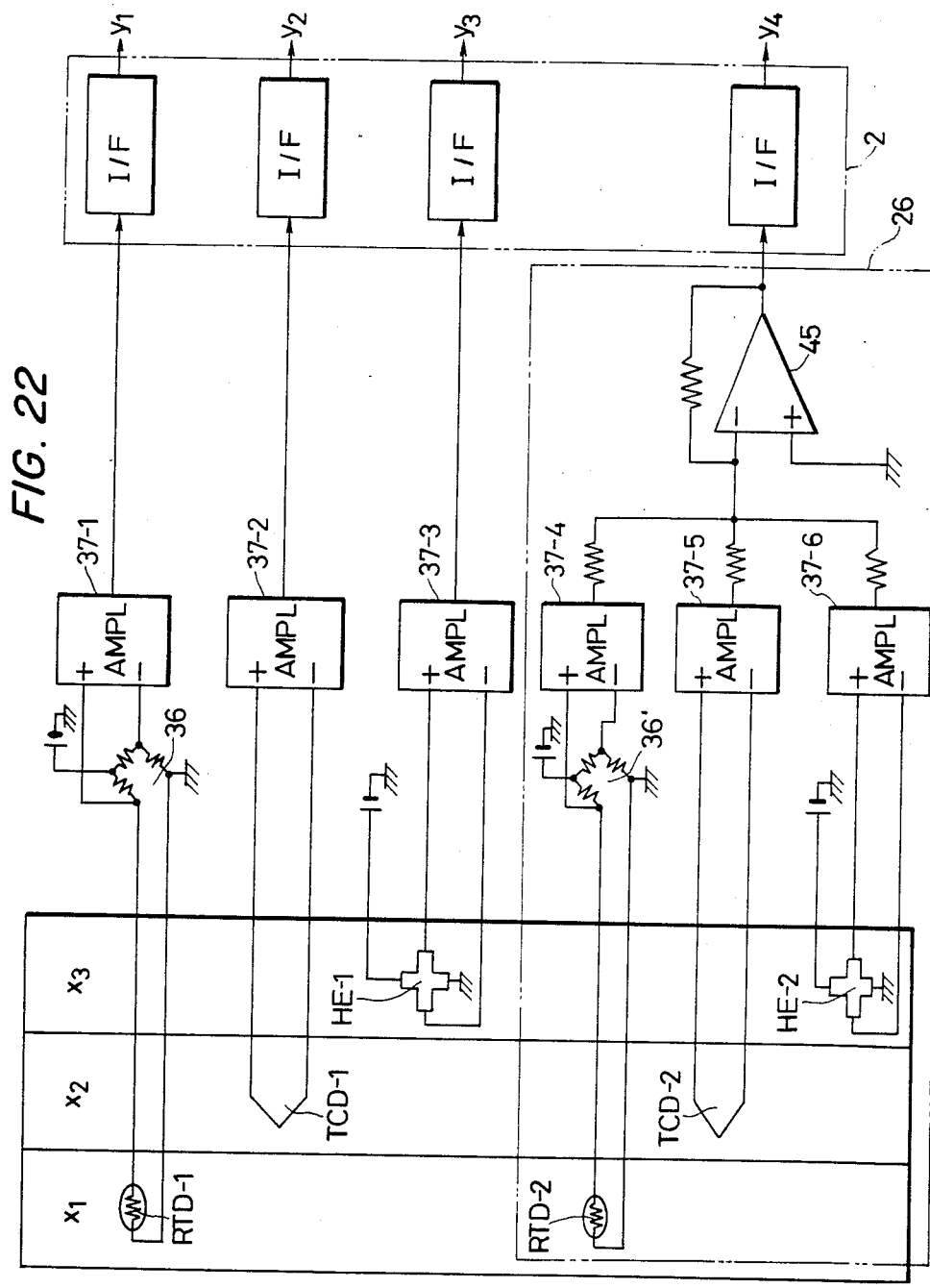
FIG. 22 is a block diagram illustrating the sixth embodiment of the present invention.

One such embodiment of this invention is illustrated in FIG. 22. In this embodiment, the physical quantities (temperature) $x_1$ and $x_2$ at the first and second sites are measured by the use of a thermoresistor RTD-1, a bridge 36, and a thermocouple TCD-1 and the physical quantity (magnetic field) $x_3$ at the third site is measured by the use of a Hall element HE-1. The measured values are fed as signals $y_1$ through $y_3$ via differential amplifiers 37-1 through 37-3 and a data acquisition system 2 to a computer (not shown).

A check signal generator 26 is additionally provided, as detection means, with a thermoresistor RTD-2, a thermocouple TCD-2, and a Hall element HE-2 which take measurement the temperature $X_1, X_2$ and the magnetic field $X_3$, at the aforementioned sites of measurement. The outputs of the various detection means mentioned above are fed via differential amplifiers 37-4 through 37-6 to an operation amplifier 45, wherein they are subjected to addition or subtraction to produce a check signal. Similarly to the conventional measured value, this check signal is fed via the data acquisition system 26 to the computer. Thereafter, by the same procedure as described above, the computation proceeds in accordance with the flow chart of FIG. 12 to execute the detection of fault in the measurement system.

In the embodiment of FIG. 22, since only one check signal generator is used, the syndrome is in a one-dimensional form and the system is barely capable of effecting only detection of fault. It may be clear, however, that the system, if provided with two or more check signal generators as involved in the foregoing embodiments, will become capable of further providing identification of the site of fault and repair of the fault.

If the scope being rendered tolerant of fault in the system can be limited to the data acquisition system, a desired check signal generator may be obtained by using an operation amplifier as described below.

Figure 20:
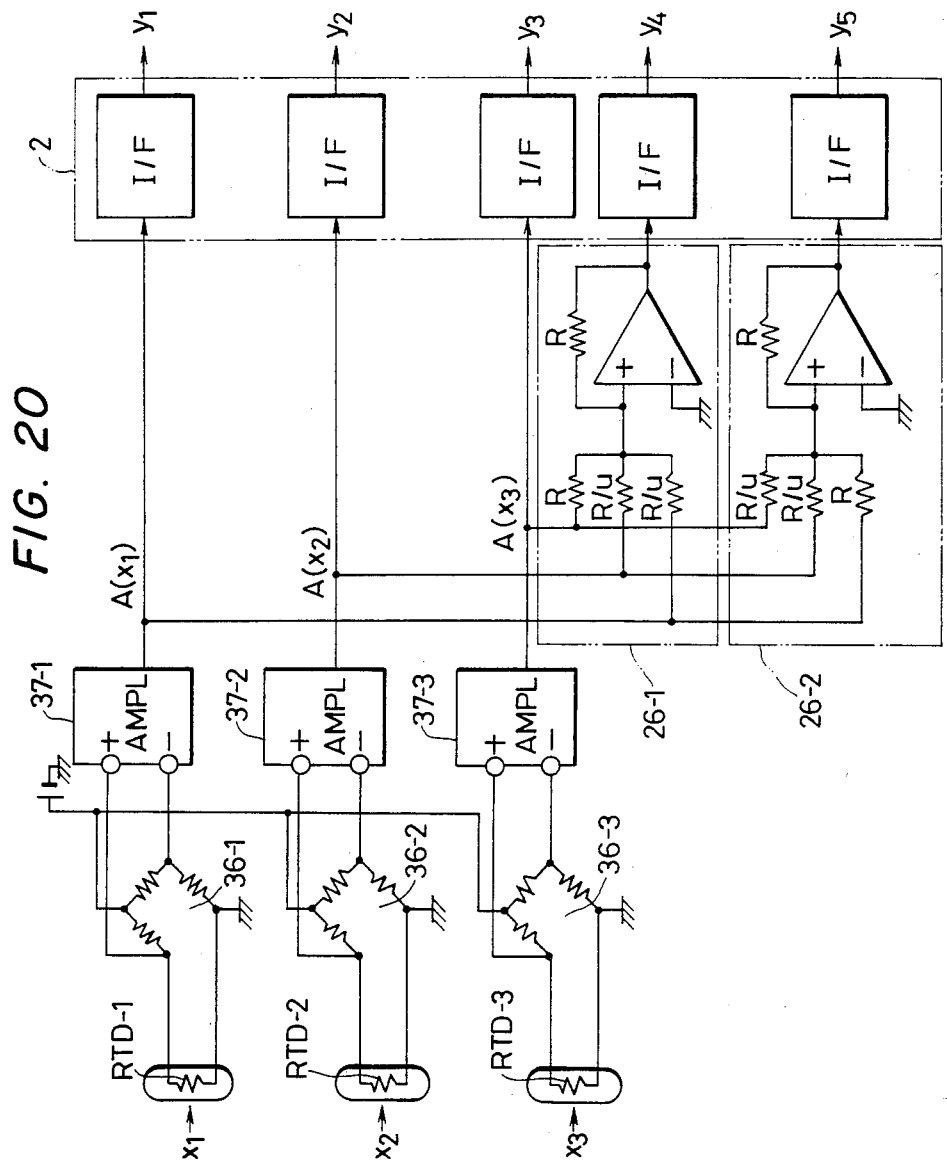
FIG. 20 is a diagram of a basic configuration of a check signal generator to be added for the purpose of rendering only the data acquisition system tolerant of failure in accordance with the present invention.

It is assumed that $A(x_1)$, $A(x_2)$, and $A(x_3)$ denote the outputs of the differential amplifiers 37-1 through 37-3 in the arrangement of FIG. 17. When (1) the check signal generators 26-1 and 26-2 materialized with operation amplifiers are added before the data acquisition system 2 as illustrated in FIG. 20, (2) the magnitudes of external resistance of the aforementioned operation amplifiers are selected as indicated in the diagram, and (3) the value of U in FIG. 20 is fixed at 1.62, there occurs the relation of the following formula (41) among the outputs $y_1$ through $y_5$ of the data acquisition system 2 and the outputs $A(x_1)$, $A(x_2)$, and $A(x_3)$ of the differential amplifiers 37-1 through 37-3.

$$\begin{bmatrix} y_1 \\ y_2 \\ y_3 \\ -y_4 \\ y_5 \end{bmatrix} = \begin{bmatrix} 1 & & \\ & 1 & \\ & & 1 \\ 1 & 1.62 & 1.62 \\ -1.62 & -1.62 & -1 \end{bmatrix} \begin{bmatrix} A(x_1) \\ A(x_2) \\ A(x_3) \end{bmatrix} \quad (41)$$

Evidently, this formula (41) becomes completely identical with the aforementioned formulas (40) and (20) when the signs of the outputs $y_4$ and $y_5$, in the aforementioned formula (41) are reversed in the computer in the subsequent step and $A(x_j)$ is substituted with $x_j$.

The correct magnitudes of $x_j$, therefore, can be found by executing the program of FIG. 12 and FIG. 13 with the computer even when fault develops in part of the data acquisition system such as, for example, any of A/D convertor and other component elements. In this case, although the differential amplifiers, bridges and sensors, cannot be protected against fault, the subsequent data acquisition system can be rendered tolerant of fault.

This invention, therefore, can be applied to a wide variety of measurement systems designed for the measurement of various physical quantities such as, for example, electric current, magnetic field, voltage, electric field, temperature, and pressure.

From the standpoint of cost, this invention excels as follows:

(A) Where the number of power transmission lines is 3, for example, the conventional TMR type measurement system necessitates addition of six optical CT's as described above for the purpose of rendering the system tolerant of fault. By contrast, for the same purpose, the measurement system according to the present invention requires addition of only two check signal generators which have the same basic construction as ordinary optical CT's. Thus, the cost incurred by this invention in rendering the system tolerant of fault is one third the cost required by the conventional method.

(B) Where the number of power transmission lines is four, the measurement system of the present invention provides required measurement by having one optical fiber wound round the four power transmission lines sequentially as may be readily inferred by any person of ordinary skill in the art from the foregoing description of the invention. Thus, the number of check signal generator sensors having the same basic construction as ordinary optical CT's which are required to be increased for the purpose of rendering the measurement system tolerant of fault is still 2.

As is clear from the foregoing explanation, generally when the number of power transmission lines is n, the conventional TMR type measurement system necessitates addition of 2n optical CT's for the purpose of rendering the system tolerant of fault. For the same purpose, the measurement system of the present invention requires addition of only two check signal generators having the same basic construction as ordinary optical CT's.

This means that when the cost required by the conventional TMR type measurement system for the purpose of rendering the system tolerant of fault is 1, the cost similarly required by the measurement system of this invention is about 1/n.

Further, this invention, even when analog signal interfaces involved in a given measurement system are of the type designed for service of the time-shared mode, permits the system to be rendered tolerant of fault simply by dualizing these interfaces.

In the phase of reliability, the present invention excels as follows.

Figure 21:
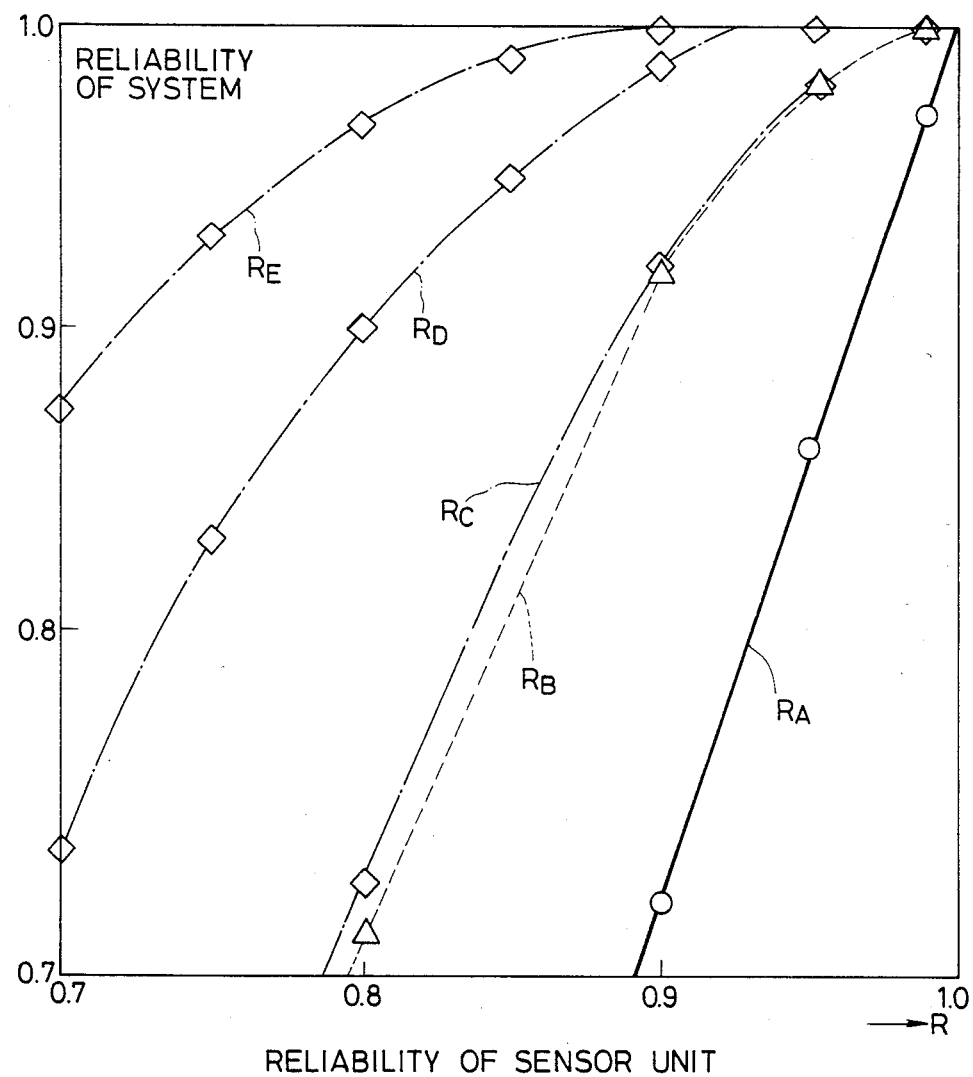
FIG. 21 is a graph illustrating the effect of the present invention manifested in imparting enhanced reliability performance.

Now a current measurement system serving three power transmission lines as shown in FIG. 5 is assumed. FIG. 21 is a graph showing the relation between the reliability R of each of the optical CT's (horizontal axis) and the reliability of a various system (vertical axis). In this graph, the curve $R_A$ represents the reliability of the sensor unit in the conventional system illustrated in FIG. 5, the curve $R_B$ represents the reliability of the sensor unit in the conventional TMR type system rendered tolerant of fault by addition of six optical CT's, and the curve $R_C$ represents the reliability of the sensor unit in the system of the present invention rendered tolerant of fault by addition of two check signal generators in one embodiment of this invention. And, the curve $R_D$ represents the reliability of the sensor unit in the system of this invention rendered tolerant of fault by addition of three check signal generators in accordance with this invention and the curve $R_E$ represents the reliability of the sensor unit in the system of this invention rendered tolerant of fault by addition of four check signal generators in accordance with this invention.

TABLE 1

| Unit R | System of FIG. 5 Curve $R_A$ | TMR type system Curve $R_B$ | System of FIG. 10 Curve $R_C$ |
|---|---|---|---|
| 0.999 | 0.9970 | 0.999991 | 0.999990 |
| 0.99 | 0.9703 | 0.99910 | 0.99902 |
| 0.95 | 0.8574 | 0.97841 | 0.97741 |
| 0.9 | 0.729 | 0.91833 | 0.91854 |
| 0.8 | 0.512 | 0.71932 | 0.73728 |
| 0.7 | 0.343 | 0.48189 | 0.52822 |

It is noted from FIG. 21 and Table 1 that the addition of two check signal generators in accordance with the present invention attains the same level of reliability as the conventional TMR method involving addition of six sensors and that the increase in the number of check signal generators to be added to three or four results in notable elevation of the reliability.

As described above, the present invention enables a given measurement system to be rendered tolerant of fault and notably improved in reliability by the addition of the irreducibly minimum redundant elements, specifically two check signal generators.

The syndrome (vector relying solely on the errors $e_j$, of the various measurement means and the check signal generators) which is mentioned above may also be calculated by another method as indicated below.

First, a fifth-order vector will be calculated as follows:

$$\dot{r} = [I - \dot{H}(\dot{H}^T\dot{H})^{-1}\dot{H}^T]\tilde{y} \quad (42)$$

$$= [r_1, r_2 \ldots r_5]$$

where, I is an unit matrix.

This vector r will be called "residual vector."

This residual vector r has the relation of the following formula (43) with the aforementioned syndrome Ŝ defined by the formula (26).

$$\dot{r} = \dot{V}^T \dot{S} \quad (43)$$

In this formula, V̇ denotes the parity check matrix of the aforementioned formula (24). Since the vector Ŝ relies solely on the errors of the various measurement means and the check signals, it is noted from the formula (43) that the residual vector ṙ is similarly a vector which relies solely on the errors of the various measurement devices and the check signals. It is further noted from the foregoing formula (43) that the relations of the following formulas (44), (45) are established.

$$||\dot{r}|| = ||\dot{S}|| \quad (44)$$

$$|\dot{r}_j| = |<\dot{S}, \dot{V}_j>| \quad (45)$$

Thus, the detection and the identification of fault illustrated in FIG. 12 will be executed by the following procedure.

(a) Detection of fault: Occurrence of fault is reported when the length of the residual vector $||\dot{r}||$ exceeds the threshold value r.

(b) Identification of fault: The number K which gives the maximum value of $|r_j|$ to the component $r_j$ (j=1, 2, ..., 5) of the residual vector is reported as the number of the site of fault.

By using the residual vector r as a syndrome, therefore, the detection of fault and the identification of the site of fault can be accomplished.

What we claim is:

1. A highly reliable measurement system, comprising: a plurality of measurement means for measuring magnitudes of a plurality of physical quantities and converting the measured magnitudes into corresponding electric signals;
at least one check signal generator for producing a check signal which is a linear combination of values which are functions of the measured magnitudes of said physical quantities;
means for determining, based on said check signal and said electric signals issuing from said measurement means, a syndrome which is a vector having a size and a direction which are a function of errors of said measurement means and said check signal generator, from which said errors of said measurement means and said check signal generator can be detected; and
means for detecting said errors of said measurement means depending on the size of said syndrome.

2. A highly reliable measurement system according to claim 1, wherein said check signal generator comprises an optical transmitter, an optical receiver, an optical fiber interconnecting said optical transmitter and said optical receiver, and as many optical transducers as the physical quantities to be measured which are inserted serially in said optical fibers and serving to convert the measured values of said physical quantities into corresponding magnitudes in the modulation of optical waves, whereby said check signal which is a linear combination of values which are functions of the measured magnitudes of said physical quantities is produced on the basis of the magnitude in the modulation of optical waves.

3. A highly reliable measurement system according to claim 1, wherein said check signal generator comprises as many transducers as the physical quantities which are connected serially and serving to convert the magnitudes of the physical quantities to be measured into corresponding magnitudes of resistance, whereby said check signal which is a linear combination of values which are functions of the measured magnitudes of the physical quantities is produced on the basis of the resultant value of the resistances in said serially connected transducers.

4. A highly reliable measurement system, comprising:
- a plurality of measurement means for measuring magnitudes of a plurality of physical quantities and converting the measured magnitudes into corresponding electric signals;
- at least one check signal generator for producing a check signal which is a linear combination of values which are functions of the measured magnitudes of said electric signals issuing from said measurement means;
- means for determining, based on said check signal and said electric signals issuing from said measurement means, a syndrome which is a vector having a size and a direction which are functions of errors of said measurement means and said check signal generator, from which the errors of said measurement means and said check signal generator can be detected; and
- means for detecting said errors of said measurement means on the basis of the size of said syndrome.

5. A highly reliable measurement system, comprising:
- a plurality of measurement means for measuring magnitudes of a plurality of physical quantities and converting the measured magnitudes into corresponding electric signals;
- at least two check signal generators for producing a check signal which is linear combination of values which are functions of the measured magnitudes of said physical quantities;
- means for determining, based on said check signal and said electric signals issuing from said measurement means, a syndrome which is a vector having a size and a direction which are a function of said measurement means and said check signal generator, from which said errors of said measurement means and said check signal generator can be detected; and
- means for locating and remedying said errors of said measurement means depending on the size and the direction of said syndrome.

6. A highly reliable measurement system according to claim 5, and further comprising means for calculating said restoring a correct magnitude of the physical quantity for the measurement means in error based on the signals, excluding the signal diagnosed to be in error.

7. A highly reliable measurement system according to claim 6, wherein said check signal generator comprises an optical transmitter, an optical receiver, an optical fiber interconnecting said optical transmitter and said optical receiver, and as many optical transducers as the physical quantities to be measured which are inserted serially in said optical fibers and serving to convert the measured values of said physical quantities into corresponding magnitudes in the modulation of optical waves, whereby said check signal which is a linear combination of values which are functions of the measured magnitudes of the physical quantities is produced on the basis of the magnitude in the modulation of optical waves.

8. A highly reliable measurement system according to claim 6, wherein said check signal generator comprises as many transducers as the physical quantities which are connected serially and serving to convert the magnitudes of the physical quantities to be measured into corresponding magnitudes of resistance, whereby said check signal which is a linear combination of values which are functions of the measured magnitudes of the physical quantities is produced on the basis of the resultant value of the resistances in said serially connected transducers.

9. A highly reliable measurement system according to claim 6, wherein each of said check signal generators is provided with as many additional means for measurement of physical quantities as the physical quantities to be measured and means for performing addition or subtraction on outputs of said additional means for measurement.

10. A highly reliable measurement system according to claim 5, wherein said check signal generator comprises an optical transmitter, an optical receiver, an optical fiber interconnecting said optical transmitter and said optical receiver, and as many optical transducers as the physical quantities to be measured which are inserted serially in said optical fibers and serving to convert the measured values of said physical quantites into corresponding magnitudes in the modulation of optical waves, whereby said check signal which is a linear combination of values which are functions of the measured magnitudes of the physical quantities is produced on the basis of the magnitude in the modulation of optical waves.

11. A highly reliable measurement system according to claim 5, wherein said check signal generator comprises as many transducers as the physical quantities which are connected serially and serving to convert the magnitudes of the physical quantities to be measured into corresponding magnitudes of resistance, whereby said check signal which is a linear combination of values which are functions of the measured magnitudes of the physical quantities is produced on the basis of the resultant value of the resistances in said serially connected transducers.

12. A highly reliable measurement system, comprising:
- a plurality of measurement means for measuring magnitudes of a plurality of physical quantities and converting the measured magnitudes into corresponding electric signals;
- at least two check signal generators for producing a check signal which is a linear combination of values which are functions of the measured magnitudes of said electric signals issuing from said measurement means;
- means for determining, based on said check signal and said electric signals issuing from said measurement means, a syndrome which is a vector having a size and a direction which are functions of errors of said measurement means and said check signal generator from which the errors of said measurement means and said check signal generator can be detected; and
- means for locating and remedying said errors of said measurement means on the basis of the size and the direction of said syndrome.

13. A highly reliable measurement system according to claim 12, and further comprising means for calculating and restoring a correct magnitude of the physical quantity for the measurement means in error, based on the signals excluding the signal diagnosed to be in error.

* * * * *